(12) United States Patent
Schmalzl

(10) Patent No.: US 10,761,135 B2
(45) Date of Patent: Sep. 1, 2020

(54) BUILT-IN SELF TEST FOR AN ARRAY OF CIRCUIT ELEMENTS

(71) Applicant: Infineon Technologies AG, Neubiberg (DE)

(72) Inventor: Erwin Schmalzl, Graz (AT)

(73) Assignee: Infineon Technologies AG, Neubiberg (DE)

( * ) Notice: Subject to any disclaimer, the term of this patent is extended or adjusted under 35 U.S.C. 154(b) by 66 days.

(21) Appl. No.: 16/128,286

(22) Filed: Sep. 11, 2018

(65) Prior Publication Data
US 2020/0081058 A1 Mar. 12, 2020

(51) Int. Cl.
*G01R 31/28* (2006.01)

(52) U.S. Cl.
CPC ................ *G01R 31/2884* (2013.01)

(58) Field of Classification Search
CPC ................................. G01R 31/2884
USPC ...................................... 324/750.3
See application file for complete search history.

(56) References Cited

U.S. PATENT DOCUMENTS

| | | | | |
|---|---|---|---|---|
| 4,805,123 A * | 2/1989 | Specht | ............ | G01N 21/95607 348/126 |
| 5,426,431 A * | 6/1995 | Ryu | ...................... | H03M 1/466 341/158 |
| 5,889,486 A * | 3/1999 | Opris | ...................... | H03M 1/68 341/150 |
| 5,977,893 A * | 11/1999 | Chen | ................... | H03M 1/1071 324/677 |
| 6,169,503 B1 * | 1/2001 | Wong | .................... | H03M 1/361 341/136 |
| 7,609,051 B2 | 10/2009 | Fritz et al. | | |
| 7,659,845 B2 * | 2/2010 | Bresch | ................ | H03M 1/1095 341/155 |
| 8,878,712 B2 | 11/2014 | Cullinane et al. | | |
| 9,584,150 B2 | 2/2017 | Bogner | | |
| 9,853,655 B1 | 12/2017 | Pemull et al. | | |
| 2002/0118017 A1 * | 8/2002 | Mori | ................ | G01R 31/31926 324/465 |
| 2005/0283664 A1 * | 12/2005 | Coulter, Jr. | ........... | G06F 11/263 714/15 |
| 2016/0181785 A1 * | 6/2016 | Simonin | ................ | H02H 3/335 361/94 |
| 2018/0198460 A1 | 7/2018 | Bogner et al. | | |

FOREIGN PATENT DOCUMENTS

WO 2017005748 A1 1/2017

\* cited by examiner

*Primary Examiner* — Jeff W Natalini
(74) *Attorney, Agent, or Firm* — Shumaker & Sieffert, P.A.

(57) ABSTRACT

In some examples, a device includes a main array of circuit elements representing a main measurement range of parameter values and a test array of circuit elements representing a test measurement range of parameter values, the test measurement range being less than the main measurement range. The device also includes processing circuitry configured to select a portion of the main array of circuit elements representing a partial measurement range, the partial measurement range being less than or equal to the test measurement range. The processing circuitry is also configured to test the portion of the main array of circuit elements using the test array of circuit elements.

20 Claims, 18 Drawing Sheets

BUILT-IN SELF TEST FOR AN ARRAY OF CIRCUIT ELEMENTS

TECHNICAL FIELD

This disclosure relates to circuits that include built-in self-testing capabilities for testing arrays of circuit elements, such as analog-to-digital converters with self-test capabilities.

BACKGROUND

An analog-to-digital converter (ADC) may include a successive-approximation register including an array of one or more circuit elements, such as capacitors, resistors, and/or a combination of capacitive elements and resistive elements. The ADC may also include a digital-to-analog converter (DAC) configured to convert a control signal (e.g., voltage or current) from a successive approximation register (SAR) to an approximation signal. The DAC can include an array of circuit elements, known as a DAC array, as referred to herein as a main array of circuit elements. A comparator of the ADC compares the approximation signal from the DAC to an input analog signal (e.g., the target signal to be converted). The SAR may receive the output signal of the comparator and run a conversion algorithm to determine a digital code for the input analog signal.

SUMMARY

This disclosure describes techniques for testing a main array of circuit elements using a test array of circuit elements representing a range of parameter values that is smaller than the range of parameter values represented by the main array of circuit elements. The techniques of this disclosure include testing a portion of the main array of circuit elements that represents a partial measurement range that is less than or equal to the test measurement range. The techniques can include selecting a portion of the main array of circuit elements and testing the portion of the main array of circuit elements using the test array of circuit elements.

In some examples, a device includes a main array of circuit elements representing a main measurement range of parameter values and a test array of circuit elements representing a test measurement range of parameter values, the test measurement range being less than the main measurement range. The device also includes processing circuitry configured to select a portion of the main array of circuit elements representing a partial measurement range, the partial measurement range being less than or equal to the test measurement range. The processing circuitry is also configured to test the portion of the main array of circuit elements using the test array of circuit elements.

A method includes selecting a portion of a main array of circuit elements, the main array of circuit elements representing a main measurement range, and the portion of the main array of circuit elements representing a partial measurement range. The method further includes testing the portion of the main array of circuit elements using a test array of circuit elements representing a test measurement range of parameter values, the test measurement range being less than the main measurement range, and the partial measurement range being less than or equal to the test measurement range.

An analog-to-digital converter (ADC) configured to generate a digital result signal based on an analog input signal, where the ADC includes a sampling array of circuit elements configured to receive the analog input signal and generate a sampled signal. The ADC also includes a main digital-to-analog conversion (DAC) circuit including a main array of circuit elements representing a main measurement range of parameter values, where the main DAC circuit is configured to receive a reference signal and a control signal and generate an approximation signal based on the reference signal and the control signal. The ADC also includes comparator circuitry configured to generate a comparison signal based on whether the sampled signal is greater than the approximation signal. The ADC further includes a test signal generator including a test array of circuit elements representing a test measurement range of parameter values, wherein the main measurement range is greater than the test measurement range. The ADC includes digital control circuitry configured to generate the control signal based on the comparison signal and further based on a conversion algorithm and deliver the control signal to the main DAC circuit. The digital control circuitry is further configured to generate the digital result signal based on the conversion algorithm and select a start value of a portion of the main array of circuit elements representing a partial measurement range, the partial measurement range being less than or equal to the test measurement range. The digital control circuitry is also configured to test the portion of the main array of circuit elements using the test array of circuit elements based on the conversion algorithm.

The details of one or more examples are set forth in the accompanying drawings and the description below. Other features, objects, and advantages will be apparent from the description and drawings, and from the claims.

BRIEF DESCRIPTION OF DRAWINGS

FIGS. 8A-13A are graphs of transfer curves for an example ADC, in accordance with some examples of this disclosure.

FIGS. 8B-13B are conceptual block diagrams a main array of circuit elements for an example ADC, in accordance with some examples of this disclosure.

DETAILED DESCRIPTION

Figure 1:
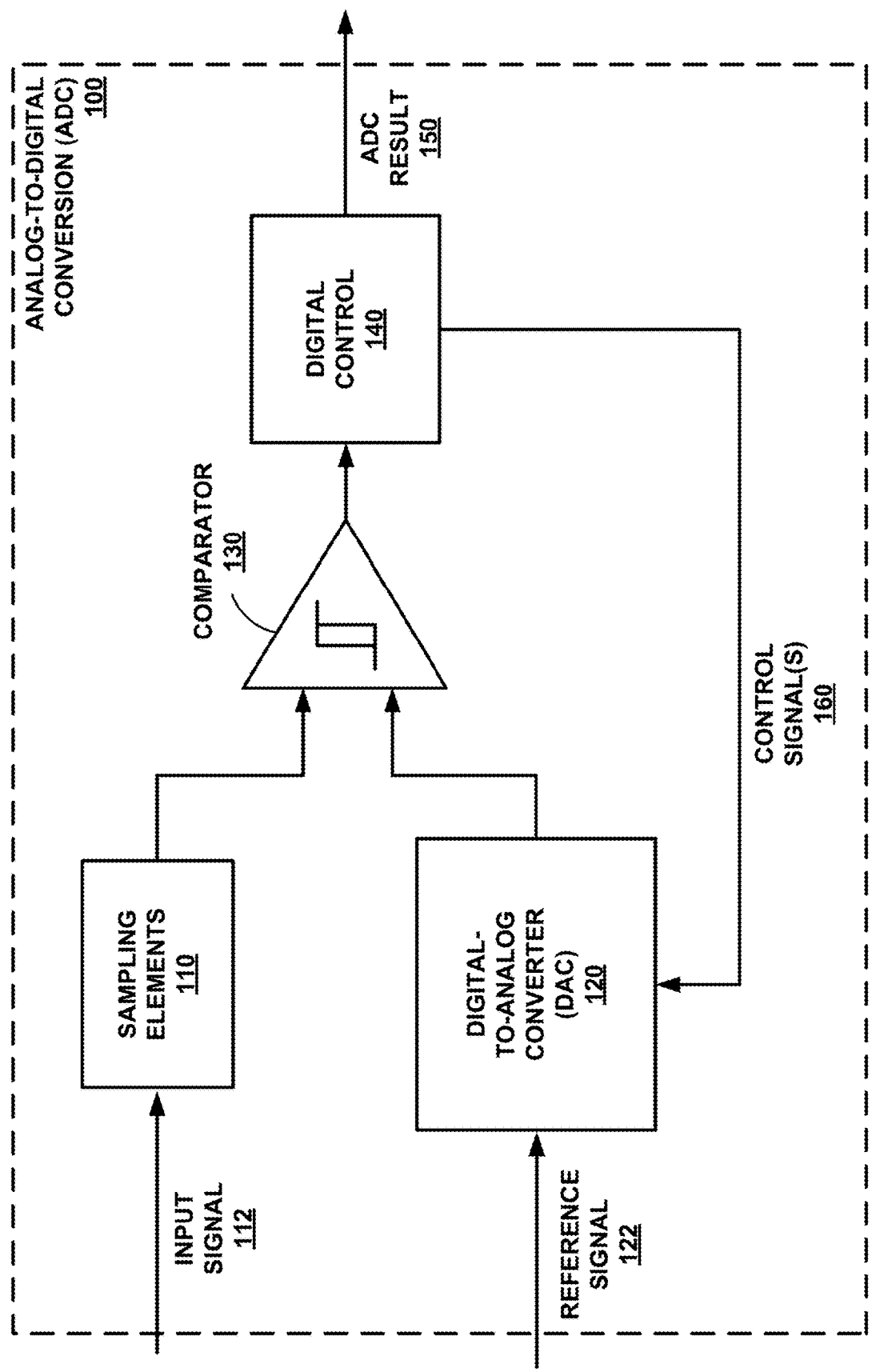
FIG. 1 is a conceptual block diagram of analog-to-digital conversion (ADC), in accordance with some examples of this disclosure.

This disclosure describes devices, methods, and techniques for testing a main array of circuit elements using a test array of circuit elements. The main array and the test array may each represent a range of parameter values in a device such as an analog-to-digital converter (ADC). The test measurement range represented by the test array of circuit elements can be significantly less than the main measurement range represented main array of circuit elements in order to reduce the chip space occupied by the test array. Thus, the test array may have fewer bits and/or circuit elements than the main array. The techniques include selecting a portion of the main array of circuit elements representing a partial measurement range that is less than or equal to the test measurement range and testing the portion of the main array of circuit elements using the test array of circuit elements.

The device may also include processing circuitry configured to use the test array of circuit elements to test only a portion of the main array of circuit elements. The processing circuitry may be configured to select the portion by selecting a start value for a conversion algorithm and running the conversion algorithm on the portion of the main array of circuit elements. By selecting just a portion of the main array of circuit elements, the processing circuitry can test a smaller array within the main array of circuit elements using the smaller test array of circuit elements.

Thus, the test array of circuit elements can be designed to be smaller, as compared to the test arrays in other devices. Using a test array of circuit elements with a smaller measurement range than the main measurement range can save cost, chip space, and complexity, as compared to a test array of circuit elements with a measurement that is the same or greater than the main measurement range. In addition, selecting a portion of the main array of circuit elements and testing the portion using the test array of circuit elements of this disclosure can be more accurate and stable, as compared to using a network of switches and resistors to shift the level of the test array of circuit elements to match each portion of the main array of circuit elements.

The circuit elements in each array can include switches, capacitances, resistances, a combination of capacitances and resistances, and/or any other type of circuit elements. The parameter values represented by each array of circuit elements can include digital numbers, capacitance values, impedance values (e.g., resistance values), voltage levels, electrical current levels, and/or any other parameter values. The measurement range of an array can be defined in terms of the equivalent capacitance of the array, the equivalent resistance of the array, the voltage range of the array, or the electrical current range of the array.

In some examples, the test array of circuit elements may be configured to have a finer resolution than the main array of circuit elements in order to provide greater precision, as compared to a test array of circuit elements with the same resolution as the main array of circuit elements. Each circuit element of the main array of circuit elements may be referred to as a "unit element." A main array with ten bits of resolution may include $2^{10}$, or 1,024, unit elements, where the resolution may also be expressed as a total voltage range or total current range, divided by the number of unit elements. The resolution of an array can be extended using sub-unit elements, where each sub-unit represents a fraction of a unit element.

For example, the main array of circuit elements may have a resolution equivalent to ten millivolts, and the test array of circuit elements may have a resolution equivalent to 2.5 millivolts. Thus, the test array has a resolution that is four times finer resolution than the resolution of the main array. In this example, the processing circuitry can test each parameter value in the partial measurement range at least three times using the parameter values of the test array of circuit elements that are associated or nearby the parameter value of the main array of circuit elements. To test a parameter value of twenty millivolts on the main array of circuit elements, the processing circuitry can cause the test array of circuit elements to output parameter values of 15, 17.5, 20, 22.5, and 25 millivolts, where this series of parameter values may be referred to as a test sweep or a partial test sweep. For each parameter value outputted by the test array of circuit elements, the processing circuitry can run a conversion algorithm on a portion of the main array of circuit elements to determine a result of running the conversion algorithm.

The result of running the conversion algorithm for parameter values of 17.5, 20, and 22.5 millivolts outputted by the test array of circuit elements should be twenty millivolts. The result of running the conversion algorithm for a parameter value of 15 millivolts may be 10 or 20 millivolts, and the result of running the conversion algorithm for a parameter value of 25 millivolts may be 20 or 30 millivolts. The processing circuitry may be configured to evaluate the results of the test sweep to determine a pass condition or a fail condition. The processing circuitry may be configured to determine the pass condition in response to determining that, for example, at least three results are twenty millivolts.

After completing the test sweep of a first portion of the main array of circuit elements, the processing circuitry may be configured to select a second portion of the main array of circuit elements for testing. To test the second portion, the processing circuitry may be configured to perform a test sweep of the second portion and evaluate the results of the test sweep. The processing circuitry may be configured to use the same test array of circuit elements for the testing of the first portion and the testing of the first portion without using level-shifting techniques (e.g., using switches and resistors) on the test array of circuit elements. Instead, the processing circuitry can select and test portions of the main array of circuit elements using a conversion algorithm, such as a successive approximation algorithm, to shift the parameter values outputted by the main array of circuit elements. In some examples, the test array of circuit elements can be used to test the entire main array of circuit elements.

The techniques of this disclosure may be particularly applicable to built-in self-tests (BISTs) for ADCs, including on-chip BISTs. For a BIST, the chip can control the conversions for an ADC, the test signals, and the evaluation. Afterwards, the BIST logic indicates a pass condition or a fail condition. A dedicated or a digital-to-analog converter (DAC), referred to as a "test signal generator," may be configured to deliver the test signal for the BIST. A test signal generator may be configured to deliver an input signal to the ADC during the normal operation of the ADC. In another device, the test signal generator may be configured to deliver input signals that can cover the complete input signal range of the ADC. A test signal generator in the other device may have a resolution finer than a resolution of a main DAC of the ADC, such as two additional least significant bits (LSBs).

For an ADC with a higher number of bits, such as twelve bits, the test signal generator may be complex. It may be difficult to guarantee the accuracy of the test levels across all conditions and production variations, especially for a test signal generator that covers a large number of bits. The continuity of the transfer curve of the test signal generator may also be an issue for a test signal generator that covers a large number of bits.

One option is a smaller test signal generator that covers only a part of the input signal range of the ADC, which is referred to as a "test signal range." A network of switches and resistors, for example, can shift this test signal range several times so that the test signal range eventually covers the complete input signal range of the ADC. However, it may be difficult to properly handle the signal shifts across the complete input signal range to satisfy matching requirements.

Sections of the input signal range may be directly related to physical parts of an ADC, where the ADC includes a DAC array controlled by a digital control logic, as shown in FIG. 1. One example configuration of an ADC includes digital control logic to implement a successive approximation register (SAR) algorithm, which may be adapted to a redundant SAR (RSAR) algorithm to relax signal settling requirements. To implement the RSAR algorithm, the digital control logic starts with an initial value, here referred to as "startval" or "start value." The digital control logic may then subsequently add or subtract so-called bitweights, which directly affect the DAC array, in order to approach the final ADC result. Selecting different values for "startval" has a direct impact on what part of the DAC array is operated by the digital control logic. The selection of the starting value can be used for testing the ADC.

FIG. 1 is a conceptual block diagram of ADC 100, in accordance with some examples of this disclosure. ADC 100 includes sampling elements 110, DAC 120, comparator 130, and digital control 140. ADC 100 is an example of device 400 shown in FIG. 4. Sampling elements 110 is an example of test array of circuit elements 410 shown in FIG. 4 and sample arrays 510, 610, and 710 shown in FIGS. 5-7. DAC 120 is an example of main array of circuit elements 420 shown in FIG. 4 and DAC arrays 520, 620, and 720 shown in FIGS. 5-7. Digital control 140 is an example of processing circuitry 440, 540, 640, and 740 shown in FIGS. 4-7. Sampling elements 110, DAC 120, comparator 130, and digital control 140 may be integrated on the same semiconductor substrate. Likewise, test array of circuit elements 410, main array of circuit elements 420, and processing circuitry 440 shown in FIG. 4 may be integrated on the same semiconductor substrate.

During an initial sampling phase, ADC 100 may be configured to receive input signal 112 (e.g., an analog input signal) at sampling elements 110. Sampling elements 110 may include an array of circuit elements, such as an array of capacitors, an array of resistors, and/or an array of a combination of capacitors and resistors. Sampling elements 110 can store a level of input signal 112. Sampling elements 110 may also be configured to generate and deliver a sampled signal to comparator 130 based on the input signal 112. ADC 100 is then configured to convert input signal 112 to ADC result 150 (e.g., a digital result, a digital output, a digital approximation, a digital code, or a digital representation), and output ADC result 150.

For the purposes of this disclosure, ADC result 150 may be described as a digital approximation of input signal 112. For example, ADC result 150 may include a digital representation that is proportional to the magnitude of the voltage or current of input signal 112, at a point in time and/or over a selected duration. ADC result 150 may express the digital representation in various ways (e.g., base-two binary code, binary coded decimal, voltage values, electrical or light pulse attributes, and the like). Digital control 140 may include a SAR configured to receive the result or output signal of comparator 130. In alternate implementations, an example ADC 100 may include fewer, additional, or alternate components. In some examples, ADC 100 is a charge redistribution ADC.

Digital control 140 may be configured to determine a digital approximation for input signal 112. Digital control 140 may output the digital results in a parallel fashion to DAC 120 with each bit outputted on an individual path. The number of parallel bits may be based on the resolution of digital control 140. Digital control 140 can output the digital results (e.g., ADC result 150) in a serial form. Digital control 140 may be configured to control a conversion algorithm such as a successive approximation algorithm. The conversion algorithm may also include one or more conversion cycles that trigger consecutive comparator decisions. At the end of the conversion algorithm procedure, digital control 140 can generate a final conversion result.

The resolution of ADC 100 may be defined based on the minimum voltage level required to cause a change in the output code of digital control 140. For example, the minimum voltage that causes a change in the digital code is the LSB of ADC 100. The resolution of ADC 100 is the LSB voltage. In some examples, digital control 140 may have eight, ten, or twelve bits of resolution, for example. Digital control 140 may also have fewer or a greater number of bits of resolution. In some examples, DAC 120 may be comprised of an array of multiple switched circuit elements. Additionally, approximating a digital value for input signal 112 (and/or converting the digital signal to an analog form within digital control 140) may be according to one or more processes or algorithms.

In some examples, digital control 140 generates and delivers control signal 160 to DAC 120, and DAC 120 converts control signal 160 to an analog form, such as an approximation signal based on reference signal 122 and control signal 160. DAC 120 can receive control signal 160 from digital control 140 via multiple bits, based on the resolution of digital control 140. Digital control 140 may be configured to generate control signal 160 based on a comparison signal output by comparator 130 to indicate whether the sampled signal received from sampling elements 110 is greater than the approximation signal received from DAC 120. As shown in FIG. 1, the analog form of the digital output may be fed back, and/or combined with or compared to input signal 112 (e.g., added, subtracted, etc.). The feedback loop of DAC 120 can provide error correction to ADC 100, as the analog form of the digital output is compared to input signal 112, reference signal 122, or another signal.

In an implementation, DAC 120 comprises an array of multiple switched circuit elements. In one example, DAC 120 array includes $2^N$ circuit elements, such as capacitances, resistances, and/or a combination of capacitances and resistances, where N is a positive integer. For instance, if a binary-weighted DAC is used for DAC 120, $2^N$ is equal to the resolution of ADC 100 in bits. In other words, each of the circuit elements of DAC 120 can represent a bit position.

Figure 2:
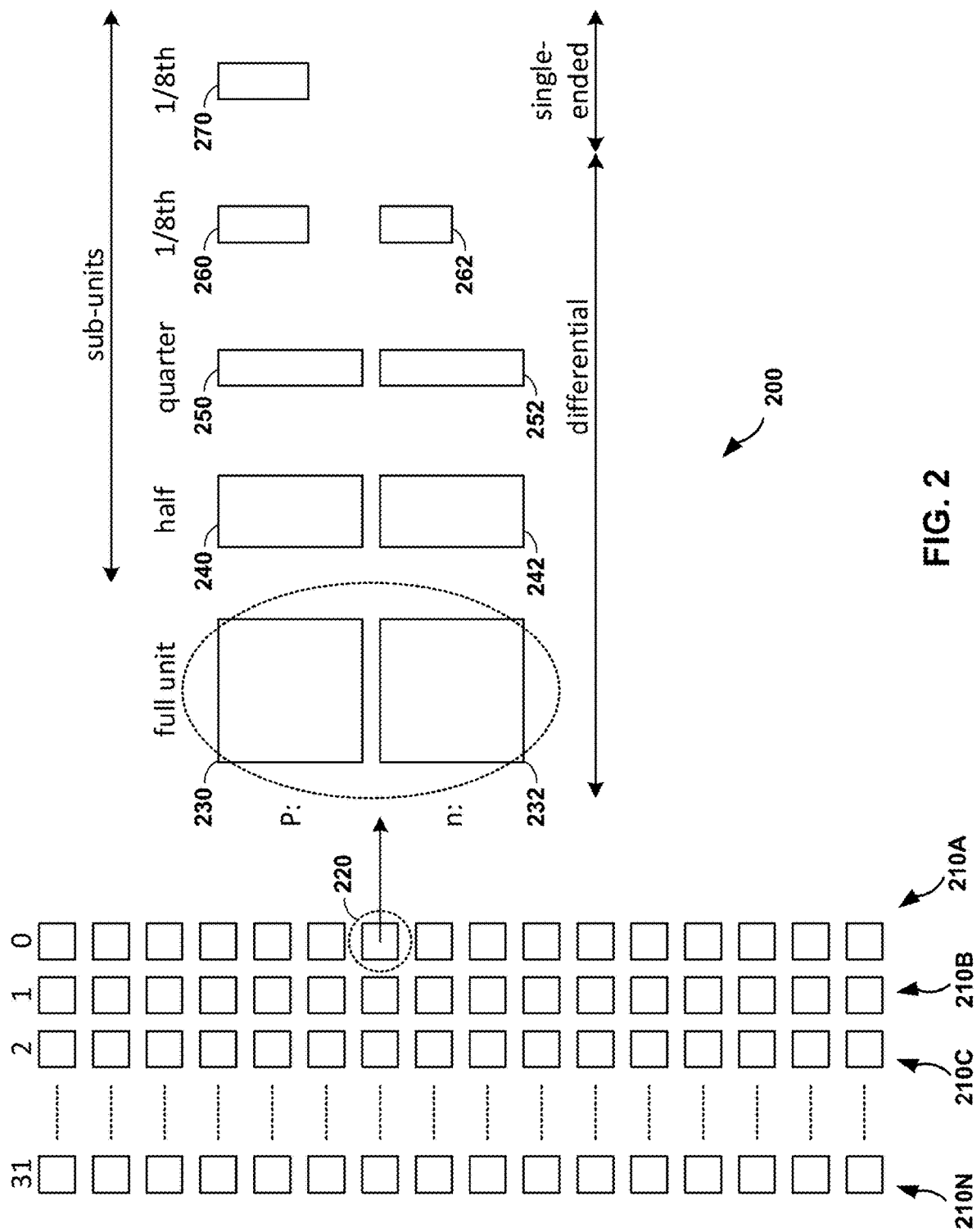
FIG. 2 is a conceptual block diagram of a main array of circuit elements, in accordance with some examples of this disclosure.

FIG. 2 shows an example of an array of circuit elements in DAC 120. In some examples, there are additional dummy circuit elements of the array that do not represent a bit position but are included for functionality of ADC 100. Additionally or alternatively, one or more of the circuit elements of the array may be implemented using a single component or multiple sub-elements, as shown by the sub-units in FIG. 2.

For a non-binary-weighted DAC 120 (also within the scope of the disclosure), N may be bigger than the bit-resolution of ADC 100. In some examples, coding logic may be used between digital control 140 and the digital output to conform the output to an application.

Additionally, sampling elements 110 may include one or more sample and hold components. For example, sampling elements 110 may include a circuit element, one or more circuit elements in an array, or the like. Sampling elements 110 can sample input signal 112 continuously, at predefined discrete moments, or at other desired durations or intervals. Input signal 112 is digitally approximated using digital control 140, and is also compared to the analog output of DAC 120 to maintain an accurate ADC 100 output. In some examples, one or more circuit elements of DAC 120 may also act as sample-and-hold components.

Additionally or alternatively, ADC 100 may include additional components or alternate components to perform the functions discussed, or for other desired functionality. In further implementations, the functional components or modules of the ADC 100 may be arranged or combined in a different arrangement, form, or configuration.

FIG. 2 is a conceptual block diagram of a main array of circuit elements 200, in accordance with some examples of this disclosure. Main array of circuit elements 200 is an example of DAC 120 shown in FIG. 1. An N-bit array contains $2^N$ unit elements or circuit elements. As an example, main array of circuit elements 200 has 16 rows and 32 columns, for a total of 512 unit elements. FIG. 2 depicts each of columns 210A, 210B, 210C, and 210N including sixteen unit elements.

FIG. 2 shows a detailed view of unit element 220, which includes a differential full unit including unit 230 of positive polarity and unit 232 with negative polarity. Main array of circuit elements 200 can also include sub-units that represent a fraction of a unit element, such as the differential half sub-unit formed by units 240 and 242, the differential quarter sub-unit formed by units 250 and 252, the differential eighth sub-unit formed by units 260 and 262, and the single-ended sixteenth sub-unit 270.

If the resolution of main array of circuit elements 200 is not extended, for example with the use of a sub-array (e.g., units 240, 242, 250, 252, 260, 262, and 270), the ADC also has N bits, where N is equal to the base-two logarithm of the number of unit elements. Thus, without sub-units, main array of circuit elements 200 would include nine bits of resolution, which is the base-two logarithm of 512. Including a half sub-unit increases the resolution to ten bits, including a half sub-unit and a quarter sub-unit increases the resolution to eleven bits, and so on. In some examples, a SAR ADC may include an N-bit ADC using an N-bit DAC array, where the codes range from zero to $2^N-1$.

Figure 3:
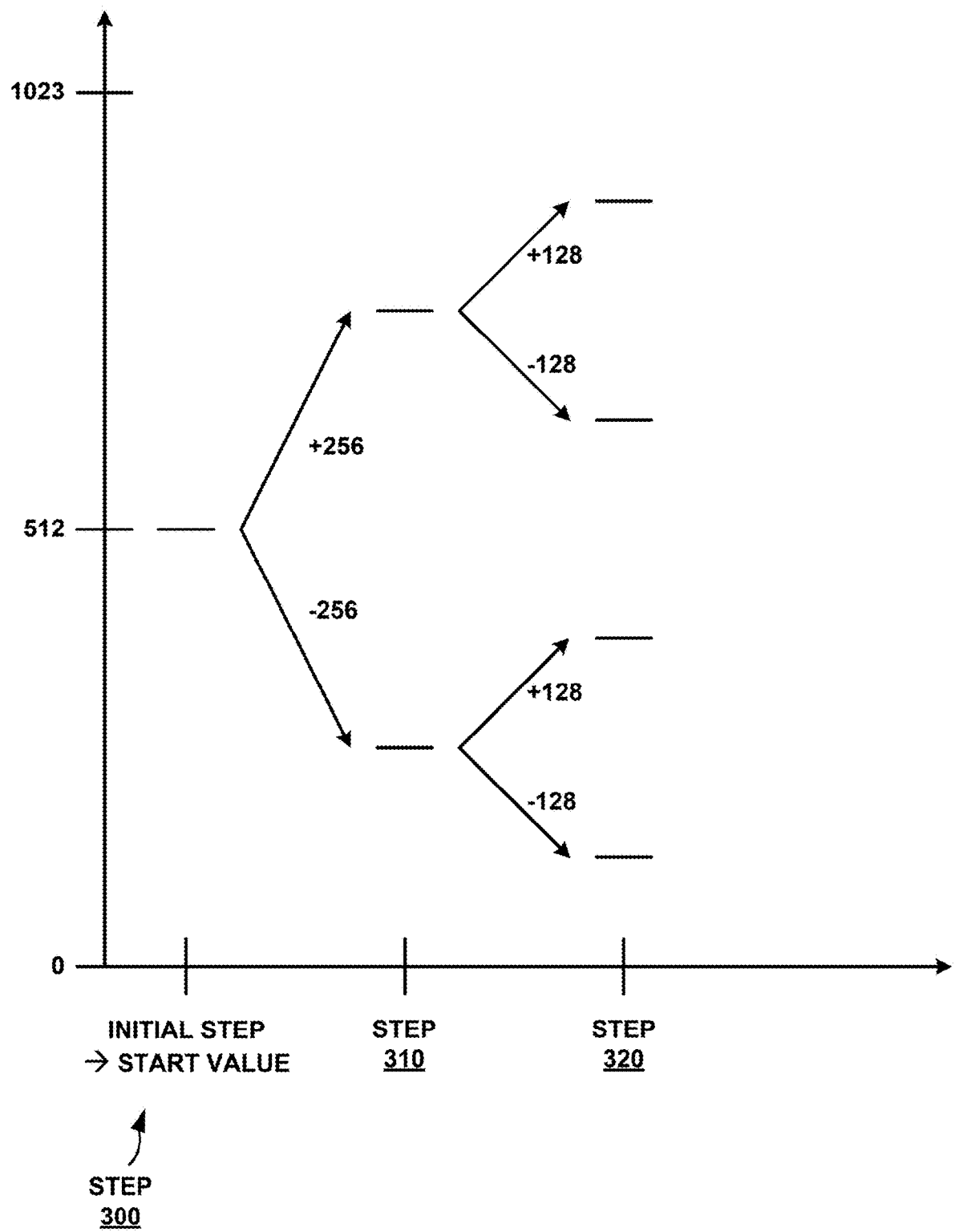
FIG. 3 is a diagram of a successive approximation register (SAR) algorithm, in accordance with some examples of this disclosure.

FIG. 3 is a diagram of a SAR algorithm, in accordance with some examples of this disclosure. The techniques of FIG. 3 are described with reference to ADC 100 shown in FIG. 1 and main array of circuit elements 200 shown in FIG. 2, although other components may exemplify similar techniques. As shown in FIG. 3, digital control 140 can start the SAR algorithm in the middle of the ADC code range at $2^{(N-1)}$. FIG. 3 depicts step 300 (e.g., the initial step) at 512, which is half of the number of unit elements (1,024) in main array of circuit elements 200 shown in FIG. 2. An ADC implementing a SAR algorithm typically selects a start value equal to the halfway point between the maximum value (e.g., $2^N-1$) and the minimum value (e.g., zero).

From one conversion step to the next, digital control 140 adds or subtracts so-called bitweights from the previous control value at DAC 120. In case of a binary search algorithm, these bitweights may be 512, 256, 128, and so on, i.e., powers of two. In case of an RSAR algorithm, the bitweights are non-binary, and there are more than N conversion steps. These additional steps represent the redundancy.

Digital control 140 determines the number of units that are selected in DAC 120 during the initial sampling phase based on the start value. If digital control 140 shifts the start value, the final value of ADC result 150 has the same shift. At step 310, if the output of comparator 130 indicates that the output of DAC 120 is greater than input signal 112, digital control will subtract 256 from the previous control value. If the output of comparator 130 indicates that the output of DAC 120 is less than input signal 112, digital control will add 256 to the previous control value. Similarly, digital control 140 uses the output of comparator 130 to determine whether to add 128 to the previous control value or subtract 128 from the previous control value.

Figure 5:
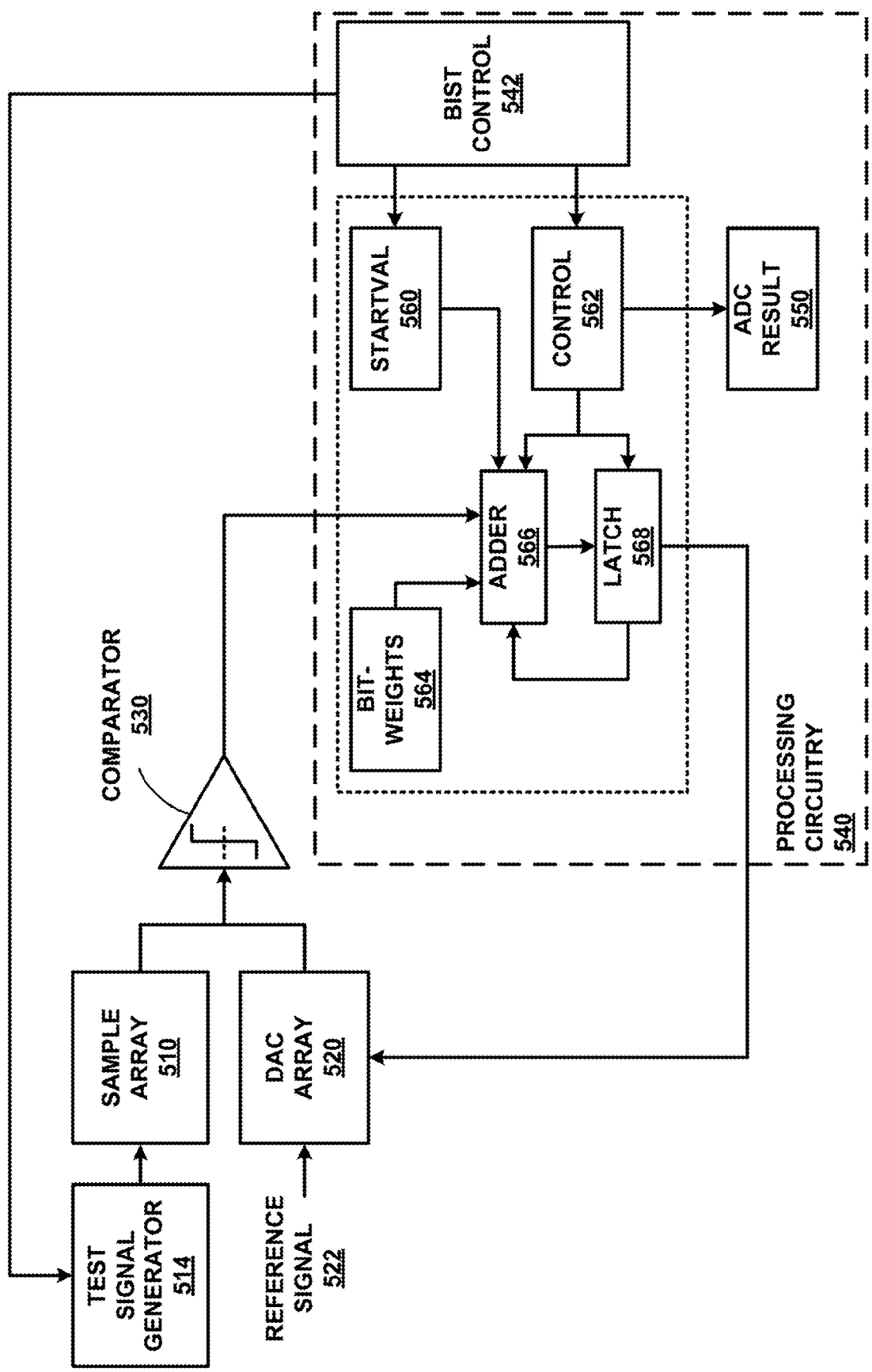
FIGS. 5-7 are conceptual block diagrams illustrating ADCs with built-in self-test (BIST) functionality, in accordance with some examples of this disclosure.
Figure 6:
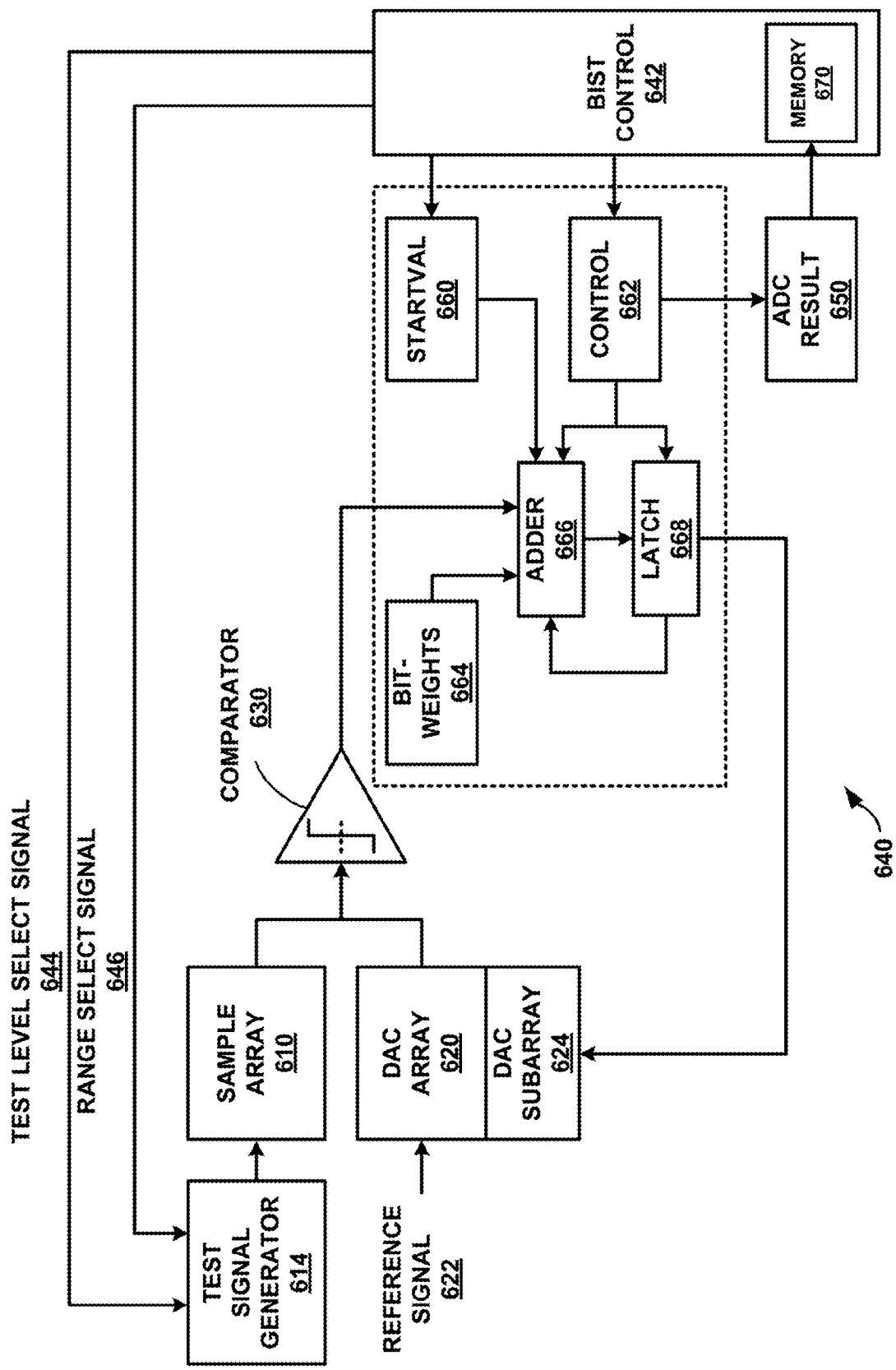
Figure 7:
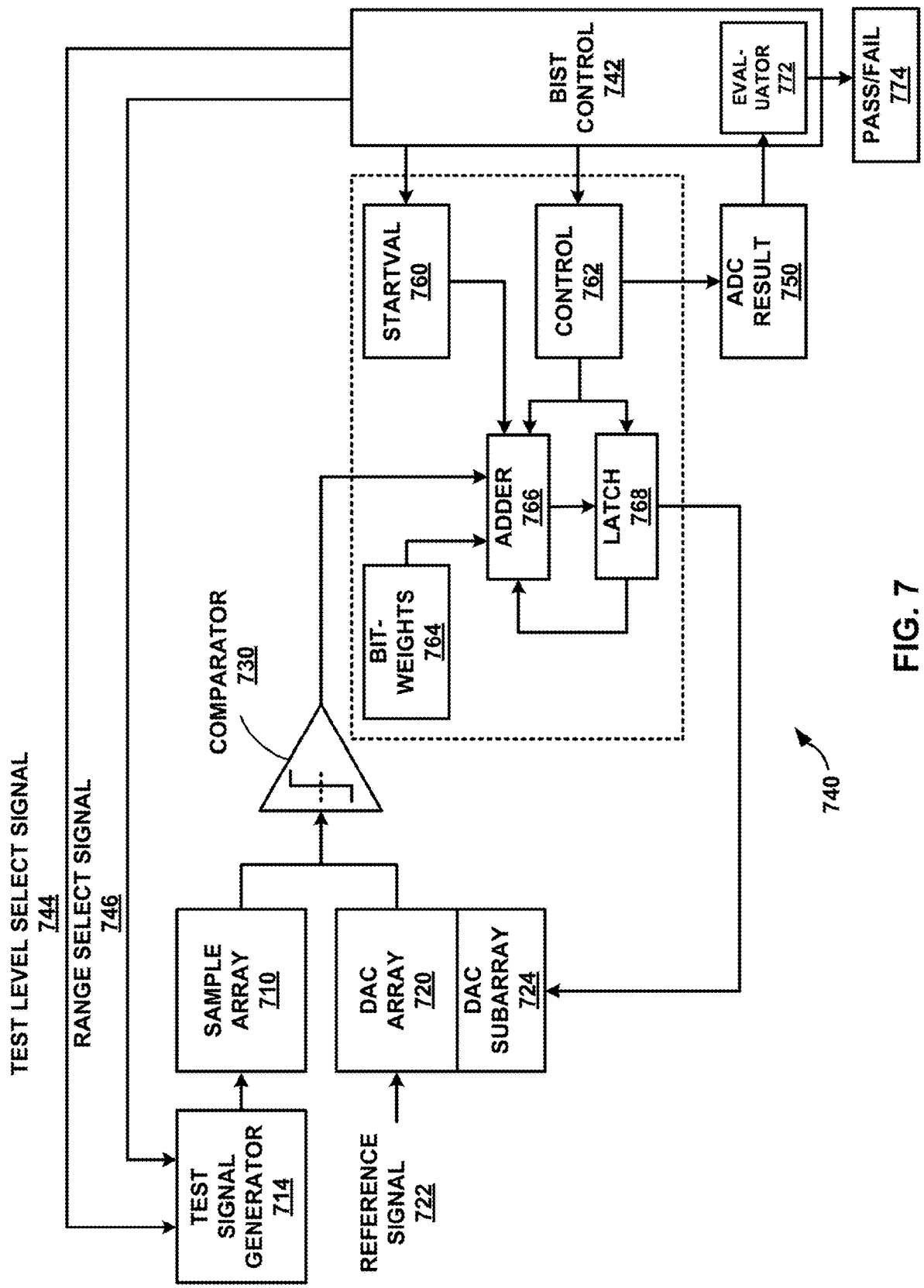

"Selection of units" can mean that unit elements of DAC 120 or main array of circuit elements 200 are activated by a switch, for example, by connecting a capacitor. "Selection of units" can also mean, in the case of an implementation with differential signals, that digital control 140 selects one of the two polarities. The structure shown in FIG. 1 or FIG. 4 can be extended to include a BIST control as shown in FIGS. 5-7. To perform a BIST as described herein, a dedicated BIST control block may be configured to operate digital control 140 to deliver a test signal to sampling elements 110.

Figure 4:
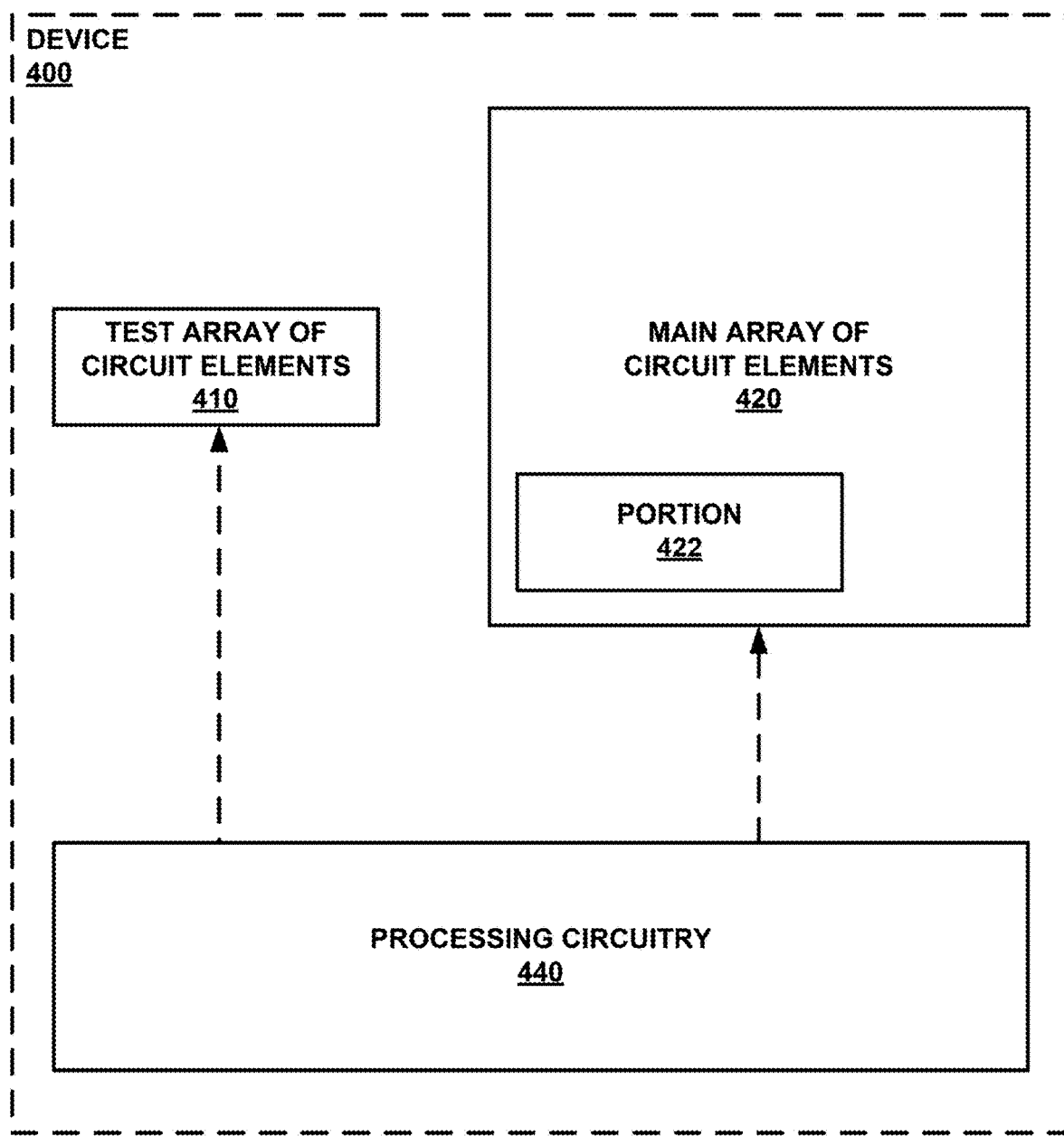
FIG. 4 is a conceptual block diagram of a device including a main array of circuit elements and a test array of circuit elements, in accordance with some examples of this disclosure.

FIG. 4 is a conceptual block diagram of a device 400 including a main array of circuit elements 420 and a test array of circuit elements 410, in accordance with some examples of this disclosure. Devices 500, 600, and 700 shown in FIGS. 5-7 are examples with additional detail of device 400. Sample arrays 510, 610, and 710 shown in FIGS. 5-7 are examples of test array of circuit elements 410. DAC arrays 520, 620, and 720 shown in FIGS. 5-7 are examples of main array of circuit elements 420. Processing circuitry 540, 640, and 740 shown in FIGS. 5-7 are examples of processing circuitry 440. Array 410 and 420 may include arrays of capacitors, arrays of resistors, and/or an array of a combination of capacitors and resistors.

Figure 8A:
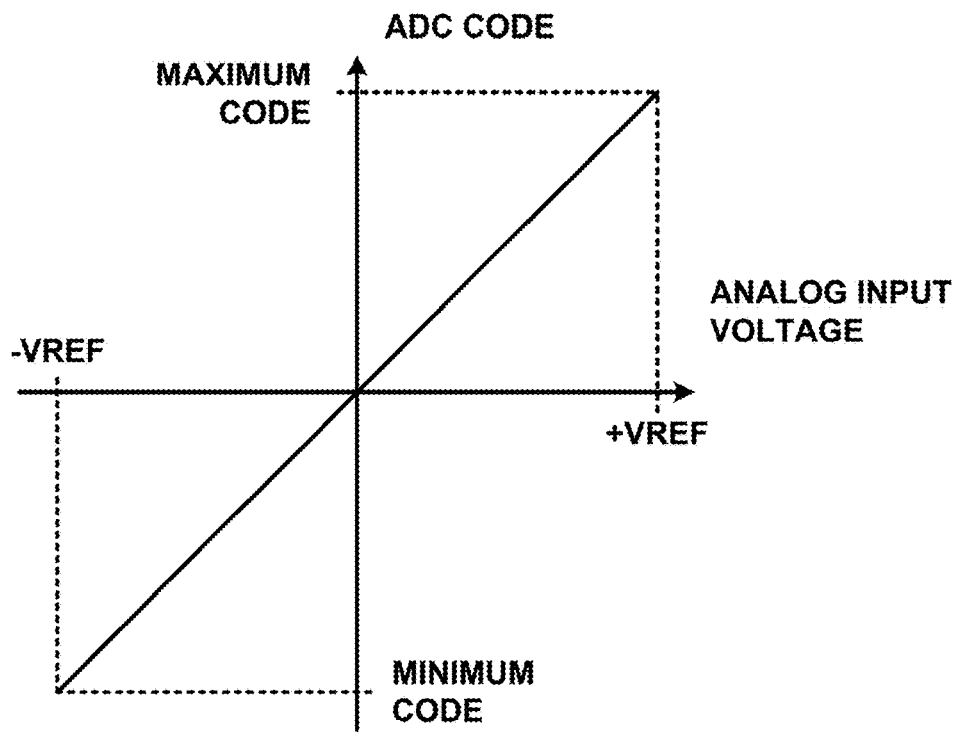
Figure 8B:
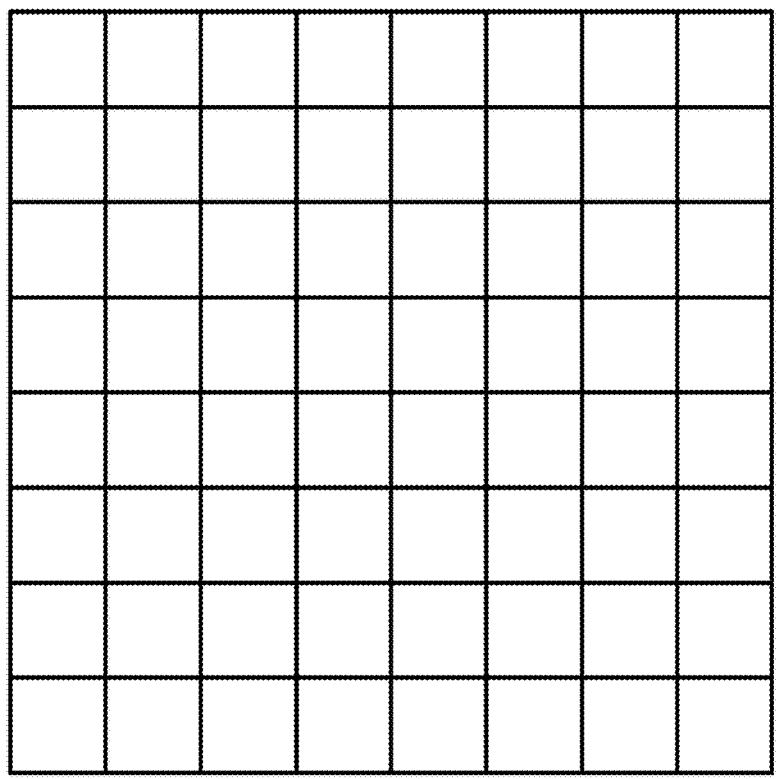

Processing circuitry 440 is configured to select portion 422 of main array 420, where portion 422 represents a partial measurement range that is less than or equal to the test measurement range represented by test array. In the example of FIGS. 8A and 8B, main array 420 represents a main measurement range of 64 units with values from zero to 63, and test array 410 represents a test measurement range of eight units with values from zero to seven.

Figure 13A:
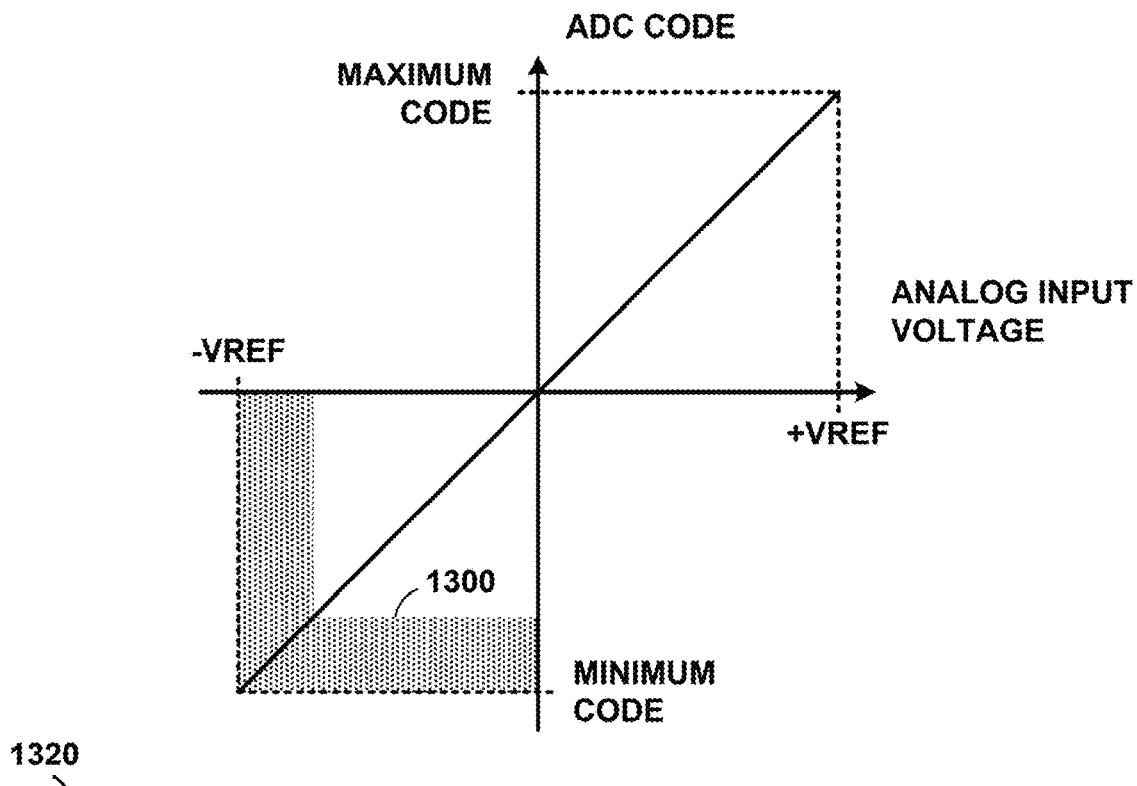
Figure 13B:
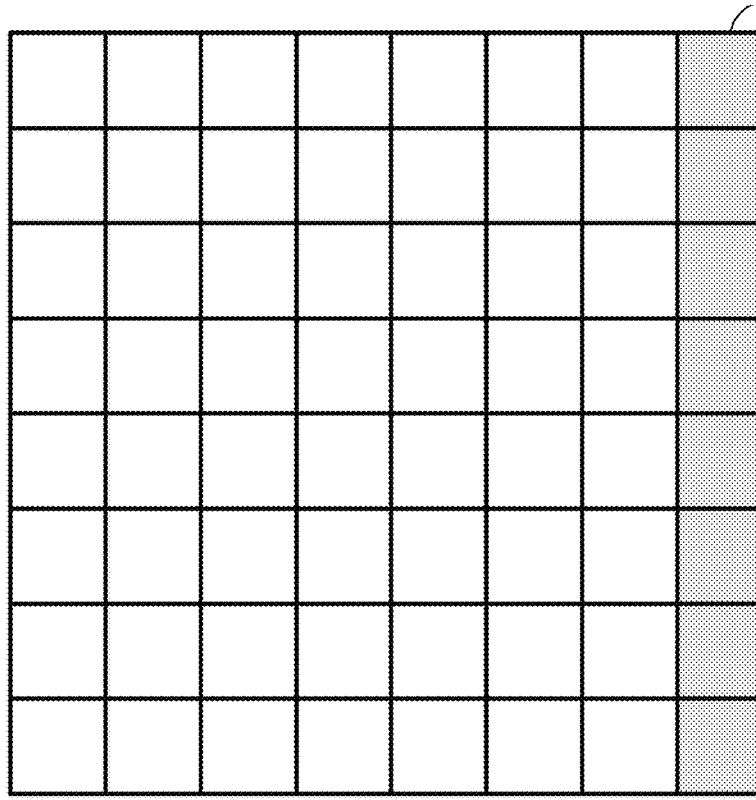

FIGS. 9A-13B illustrate examples of portion 422, where main arrays 820, 920, 1020, 1120, 1220, and 1320 have 64 unit elements. For example, portion 922 shown in FIG. 9B represents a partial measurement range of eight units from 32 to 39. Portion 1022 shown in FIG. 10B represents values from 40 to 47. Portion 1122 shown in FIG. 11B represents values from 48 to 55. Portion 1222 shown in FIG. 12B represents values from eight to fifteen. Portion 1322 shown in FIG. 13B represents values from zero to seven.

Processing circuitry 440 is further configured to test portion 422 using test array 410. Processing circuitry 440 may be configured to control a BIST of main array 420 using test array 410. Processing circuitry 440 can initiate the BIST in response to user input (e.g., delivering a signal to an input/output node of device 400) and/or autonomously initiating the BIST. Processing circuitry 440 may be configured to evaluate a result of the test to determine a pass condition or a fail condition. Processing circuitry 440 can determine the pass condition if the result of the testing matches the desired result based on a test level select signal delivered by processing circuitry 440 to a test signal generator, as shown in FIGS. 6 and 7.

Arrays 410 and 420 and processing circuitry 440 may be integrated on a single semiconductor substrate. By designing a test array 410 to test only portion 422, rather to test all of main array 420 in a single sweep, the size of the single semiconductor substrate can be reduced, as compared to a device with a test array that is equal in size to or larger than the main array.

Processing circuitry 440 may include any combination of integrated circuitry, discrete logic circuitry, analog circuitry, such as one or more microcontrollers, one or more microprocessors, DSPs, application specific integrated circuits (ASICs), and/or field-programmable gate arrays (FPGAs). The term "processor" or "processing circuitry" refers one or more processors distributed across one or more devices. For example, "processor" or "processing circuitry" can include a single processor or multiple processors on a device. "Processor" or "processing circuitry" can also include processors on multiple devices, where the operations described herein may be distributed across multiple processors and/or multiple devices.

FIGS. 5-7 are conceptual block diagrams illustrating ADCs with built-in self-test (BIST) functionality, in accordance with some examples of this disclosure. In the example of FIG. 5, BIST control 542 may be configured to select a portion of DAC array 520 by, for example, selecting start value 560. BIST control 542 may then be configured to perform a sweep of test signal generator 514 to cover all of the partial measurement range. The elements of each of FIGS. 5-7 may be integrated onto a single semiconductor substrate.

In the example of FIG. 5, BIST control 542, through control 562, causes adder 566 to deliver start value 560 to latch 568, which delivers a control value to DAC array 520 during an initial step. During a subsequent steps, BIST control 542, through control 562, causes adder 566 to add or subtract bit-weights 564 from the previous control value. Latch 568 then holds and delivers the updated control value to DAC array 520. At the final step, BIST control 542 causes control 562 to output ADC result 550. BIST controls 642 and 742 shown in FIGS. 6 and 7 may operate in a similar manner.

FIG. 6 depicts additional details, including DAC subarray 624, test level select signal 644, range select signal 646, and memory 670. DAC subarray 624 includes sub-units that can provide additional resolution to DAC array 620. DAC subarray 624 may also include sub-units that are fractions of the unit elements within DAC array 520. Units 240, 242, 250, 252, 260, 262, and 270 are examples of sub-units that may be included in DAC subarray 624.

Memory 670 may be configured to store results for each parameter value outputted by sample array 610 in response to test level select signal 644. For example, BIST control 642 may be configured to deliver test level select signal 644 to test signal generator 614 to cause sample array 610 to output a first parameter value. While sample array 610 is outputting the first parameter value, BIST control 642 may cause control 662 to run a conversion algorithm to determine ADC result 650. BIST control 642 may be configured to store ADC result 650 or a set of ADC results 650 to memory 670.

BIST control 642 may be configured to deliver range select signal 646 to test signal generator 614 to set the range of a test sweep of sample array 610. For example, to test DAC subarray 624, BIST control 642 delivers signals 644 and 646 to test signal generator 614 to cause sample array 610 to output one or more parameter values corresponding to the DAC subarray 624.

Figure 14:
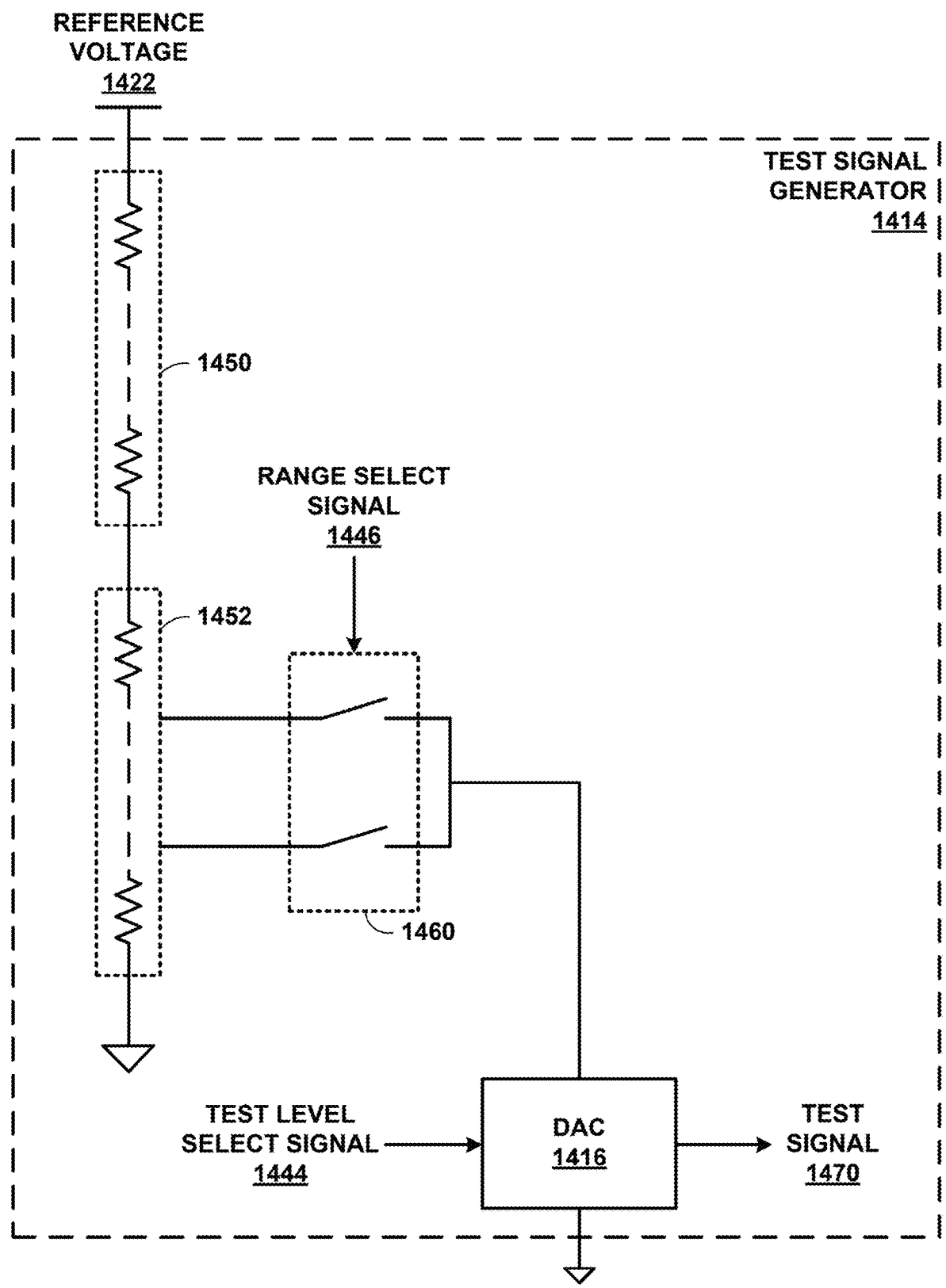
FIG. 14 is a circuit diagram of an example test signal generator, in accordance with some examples of this disclosure.

Some ADC configurations include DAC subarray 624 added to DAC array 620 to increase the number of bits in the resolution of DAC array 620. FIG. 7 shows a similar configuration with DAC subarray 724 added to DAC array 720. Returning to the description of processing circuitry 640 shown in FIG. 6, DAC subarray 624 can use fractions of the unit elements in DAC array 620 as well as fractions of reference signal 622 or different signal structures like single-ended signals instead of differential signals. Using DAC subarray 624 increases the resolution of the ADC by adding LSBs to DAC array 620. BIST control 642 may be configured to test the LSBs in DAC subarray 624 using range select signal 646. FIG. 14 shows an example design for test signal generator 614 to control the range and resolution of the output of test signal generator 614.

In the case of testing DAC subarray 624, BIST control 642 can include range select signal 646. The number of test signal levels does not have to change, but there is no limitation. The evaluation of ADC result 650 (see, e.g., evaluator 772 shown in FIG. 7) changes with different ranges, but the evaluation procedure can be very similar to the evaluation of the main DAC array (e.g., DAC array 620).

Returning to the description of processing circuitry 740 shown in FIG. 7, Evaluator 772 may be configured to receive and evaluate ADC result 750, which may include a single result or a set of results. In response to determining that ADC result 750 matches a desired result, evaluator 772 may be configured to determine and output pass condition 774. In response to determining that ADC result 750 does not match the desired result or does not satisfy a threshold, evaluator 772 may be configured to determine and output fail condition 774. Fail condition 774 may be an indication that DAC array 720, which includes DAC subarray 724, has a defect.

Evaluator 772 may be configured to determine the location of the defect in DAC array 720 based on start value 760 and test level select signal 744 associated with ADC result 750. For example, in response to determining a missing code in a set of ADC results 750, evaluator 772 may be configured to determine start value 760 and test level select signal 744 associated with the missing code. Evaluator 772 may be configured to collect ADC results 750 for a test signal sweep and afterwards check for missing codes or perform a statistical analysis of ADC results 750.

In some examples, BIST control 742 is configured to purposely introduce an error in the conversion algorithm. BIST control 742 may be configured to use the error to validate the overall test procedure. For example, BIST control 742 can introduce an error by setting an LSB to a fixed value or by omitting one of the ADC codes. Thus, BIST control 742 would test DAC array 720 and expect fail condition 774.

FIGS. 8A-13A are graphs of transfer curves for an example ADC, in accordance with some examples of this disclosure. FIGS. 8B-13B are conceptual block diagrams of main arrays of circuit elements for example ADC's, in accordance with some examples of this disclosure. FIGS. 8B-13B show main arrays with 64 unit elements. The unit elements can be implemented using switches, capacitors, and selection logic. The structure of an ADC may allow for differential, bipolar input signals. Thus, processing circuitry may be configured to determine an ADC result using Equation (1).

$$\text{ADC result} = (\text{start value}) + 2^{N-1} \times \frac{V_{sig}}{V_{ref}} \quad (1)$$

For a conversion algorithm, the start value may be half of the ADC output range, which may be $2^{N-1}$ for an N-bit ADC. Main array 820, for example, has N=6 bits of resolution. In the examples of FIGS. 8B-13B, the start value could be 32, which is half of the output range of 64. Thus, the right half of the unit elements of FIG. 8B would be selected. Positive input signals can make use of the left half of the unit elements (while the right half is selected and stays that way). Negative input signals can make use of the units in the right half of the unit elements.

In the example transfer curve of FIG. 8A, the valid input signal range stretches from −Vref to +Vref, where Vref is the reference voltage (e.g., the voltage level of reference signal 122, 522, 622, or 722). The ADC code may increase in steps depending on the input voltage (e.g., input signal 112). The transfer curve could also reflect electrical currents as a function of the input electrical current, instead of voltage.

Figure 9A:
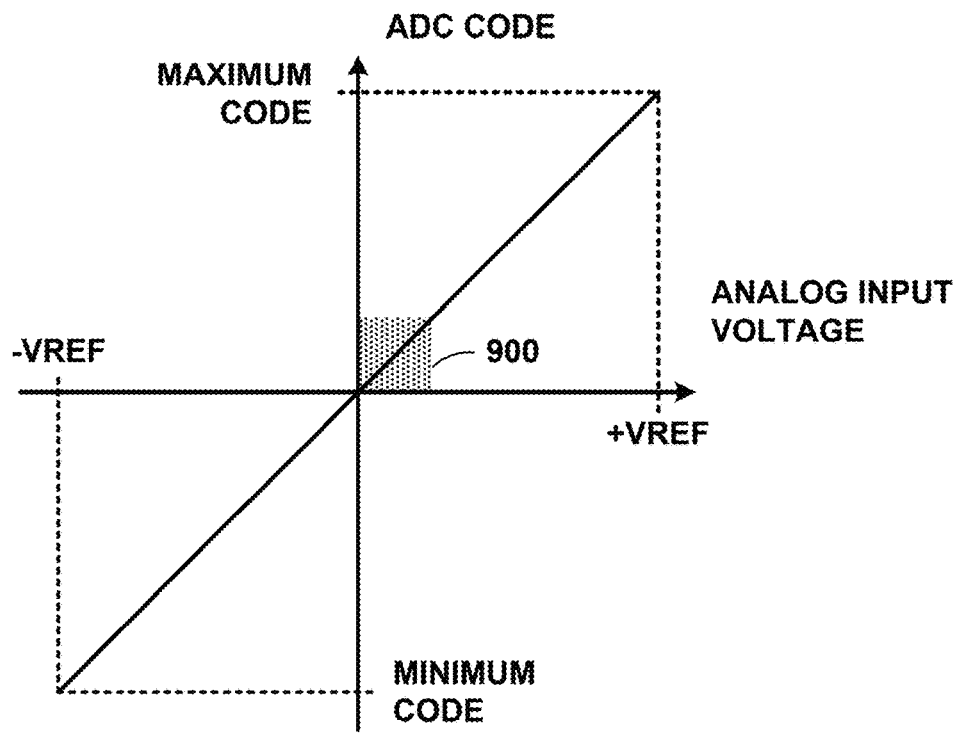
Figure 9B:
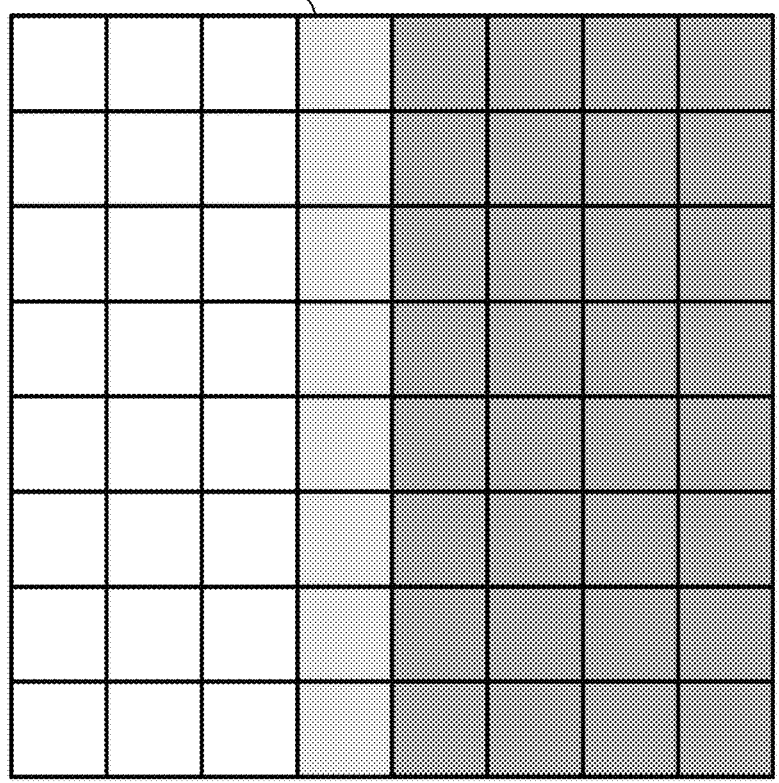

In the example of FIGS. 9A and 9B, a test signal generator may have a measurement range of eight, which is less than the measurement range of 64 for main array 920. Because of the limited range of the test signal generator, the processing circuitry can test only a small part of main array 920 (e.g., portion 922). The resolution of the test signal generator must be sufficient to reliably check all eight unit elements of portion 922. In some examples, a sufficient resolution may be two times, four times, or eight times the resolution of portion 922, which is one unit element in the example of FIG. 9B. FIG. 9A shows the partial measurement range of portion 922 on a transfer curve.

Figure 10A:
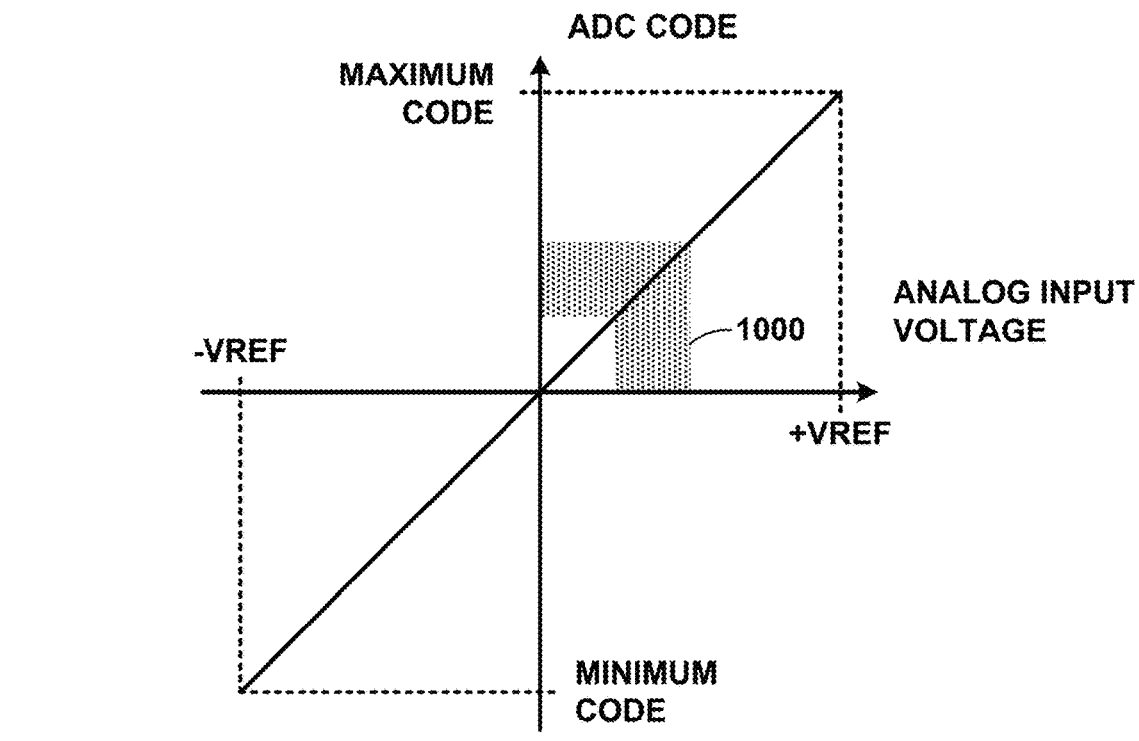
Figure 10B:
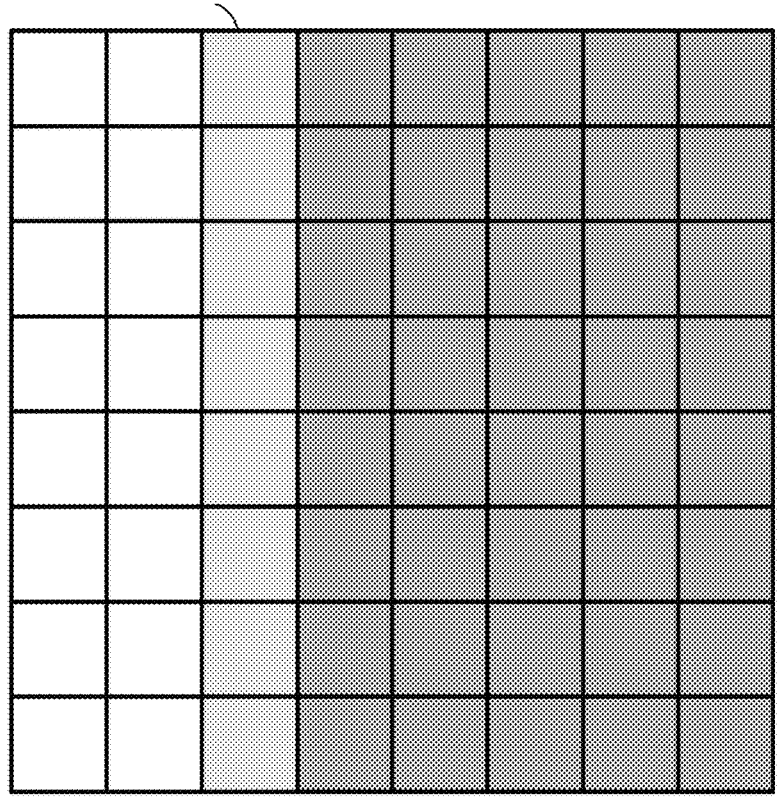
Figure 11A:
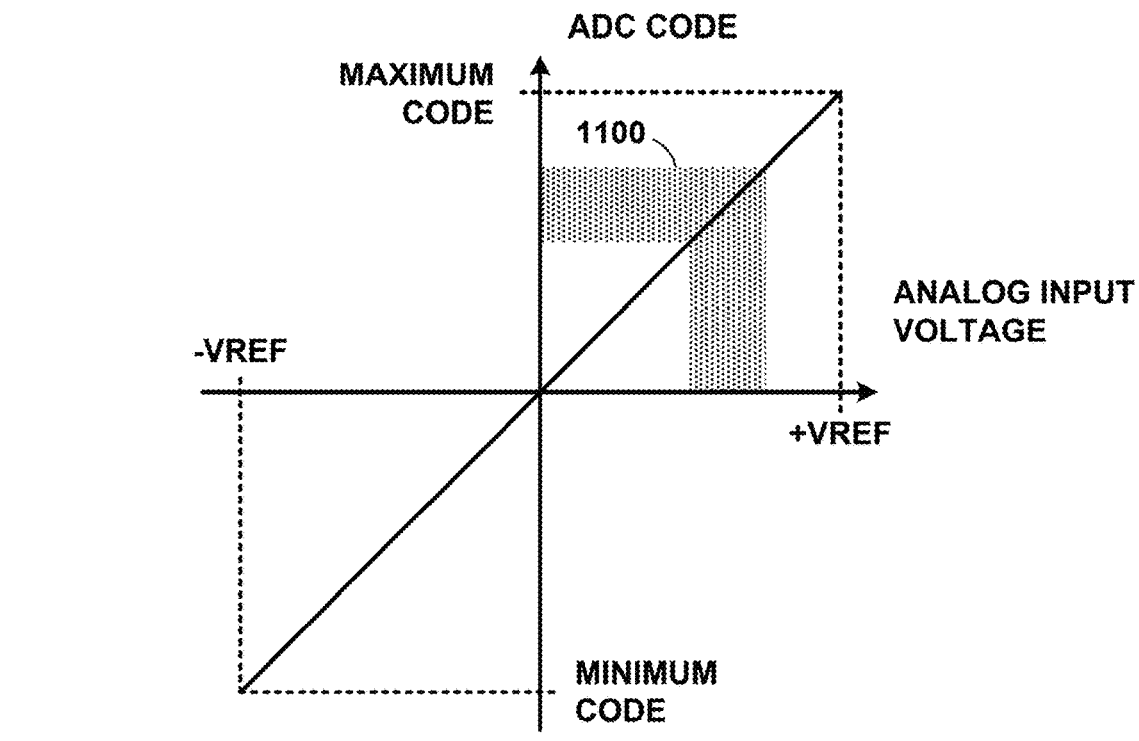
Figure 11B:
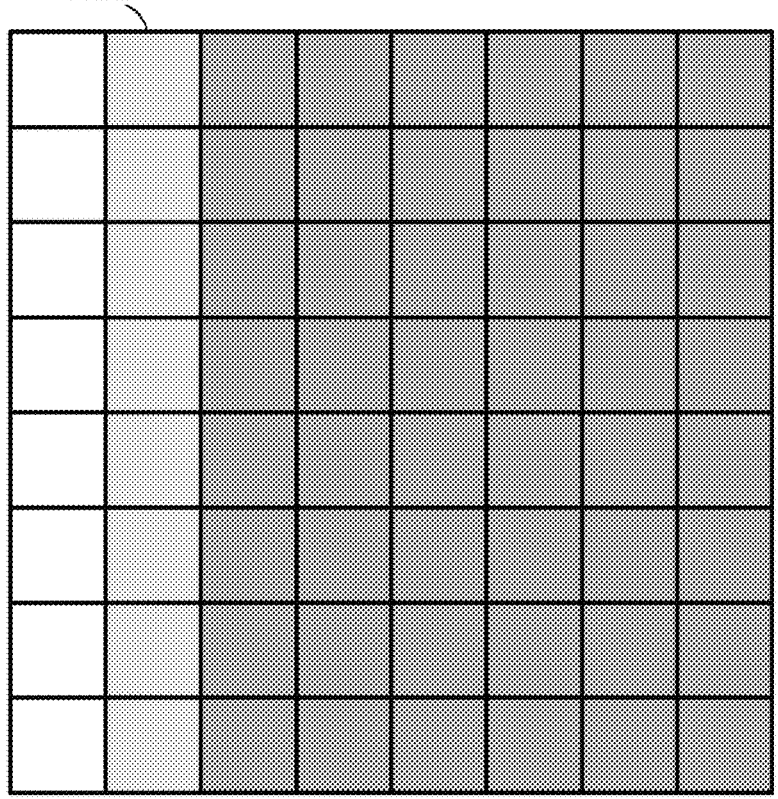
Figure 12A:
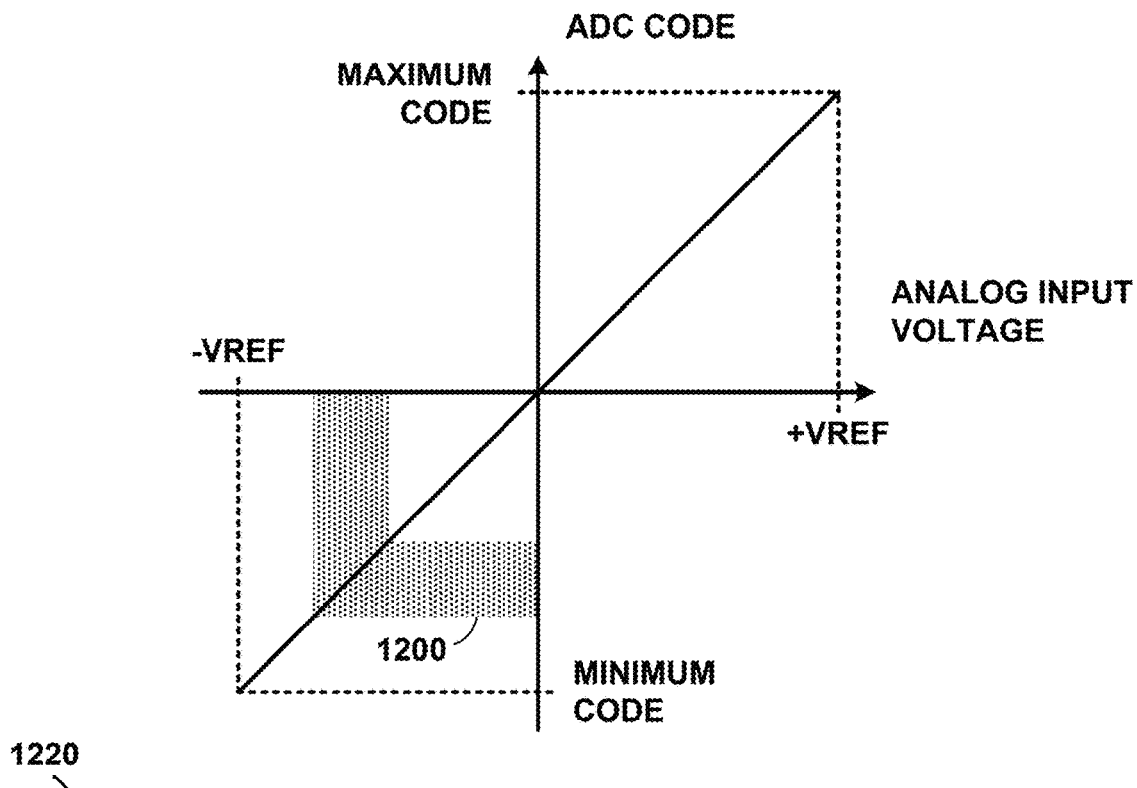
Figure 12B:
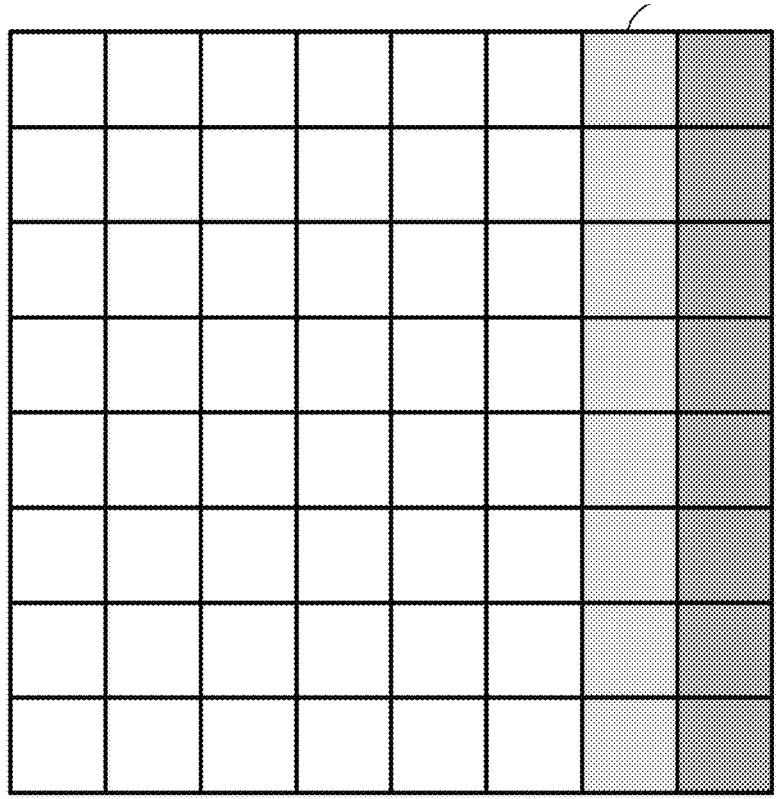

In the example of FIGS. 10A and 10B, the start value is forty, and portion 1022 is eight unit elements (e.g., 40 to 47). In the example of FIGS. 11A and 11B, the start value is 48, and portion 1122 is eight unit elements (e.g., 48 to 55). In the example of FIGS. 12A, 12B, 13A, and 13B, portions 1222 and 1322 cover ranges used by negative differential signals. The start value for portion 1222 is eight, and the start value for portion 1322 is zero. When a test signal generator with a reduced test measurement range is used with special control of the main array, the processing circuitry can use the test signal generator to test all portions of the main array.

The processing circuitry may be configured to determine the number of sections or portions ($n_{sect}$) of the transfer curve to test, as shown in Equation (2). $V_{in,max}$ is twice the reference voltage in examples with differential signals.

$$n_{sect} = V_{in,max} \div V_{test,max} \quad (2)$$

The processing circuitry can determine the start value for each section or portion using Equation (3). The variable K covers the range of zero to ($n_{sect}$−1).

$$\text{startval}(K) = K \times (2^n \div n_{sect}) \quad (3)$$

FIG. 14 is a circuit diagram of an example test signal generator 1414, in accordance with some examples of this disclosure. Test signal generator 1414 is an example of test signal generators 514, 614, and 714 shown in FIGS. 5-7. Test array 1410 is an example of sampling elements 110 shown in FIG. 1, test array of circuit elements 410 shown in FIG. 4, and sample arrays 510, 610, and 710 shown in FIGS. 5-7. Test level select signal 1444 is an example of test level select signals 544, 644, and 744 shown in FIGS. 5-7. Range select signal 1446 is an example of range select signals 546, 646, and 746 shown in FIGS. 5-7. Reference voltage 1422 shown in FIG. 14 is an example of reference signal shown in FIG. 1 and reference signals 122, 522, 622, and 722.

Impedances 1450 and 1452 may be configured to scale reference voltage 1422 to two or more voltage signals. FIG. 14 depicts impedances 1450 and 1452 as resistors connected in series, but impedances 1450 and 1452 may include alternative configurations including, for example, fewer resistors connected in series, resistors connected in parallel, capacitors connected in series or in parallel, diodes, and/or transistors. Switches 1460 may be configured to deliver one of the scaled voltage signals to test array 1410 based on the switch that is activated by range select signal 1446.

Switches 1460 may be configured to receive range select signal 1446 from processing circuitry (e.g., BIST control 542, 642, or 742). If range select signal 1446 does not activate either of switches 1460, test array 1410 may not receive a divided voltage signal. Test array 1410 may be configured to output test signal 1470 based on the voltage signal from switches 1460 and test level select signal 1444. Test array 1410 may be configured to receive test level select signal 1444 from processing circuitry (e.g., BIST control 542, 642, or 742).

Figure 15:
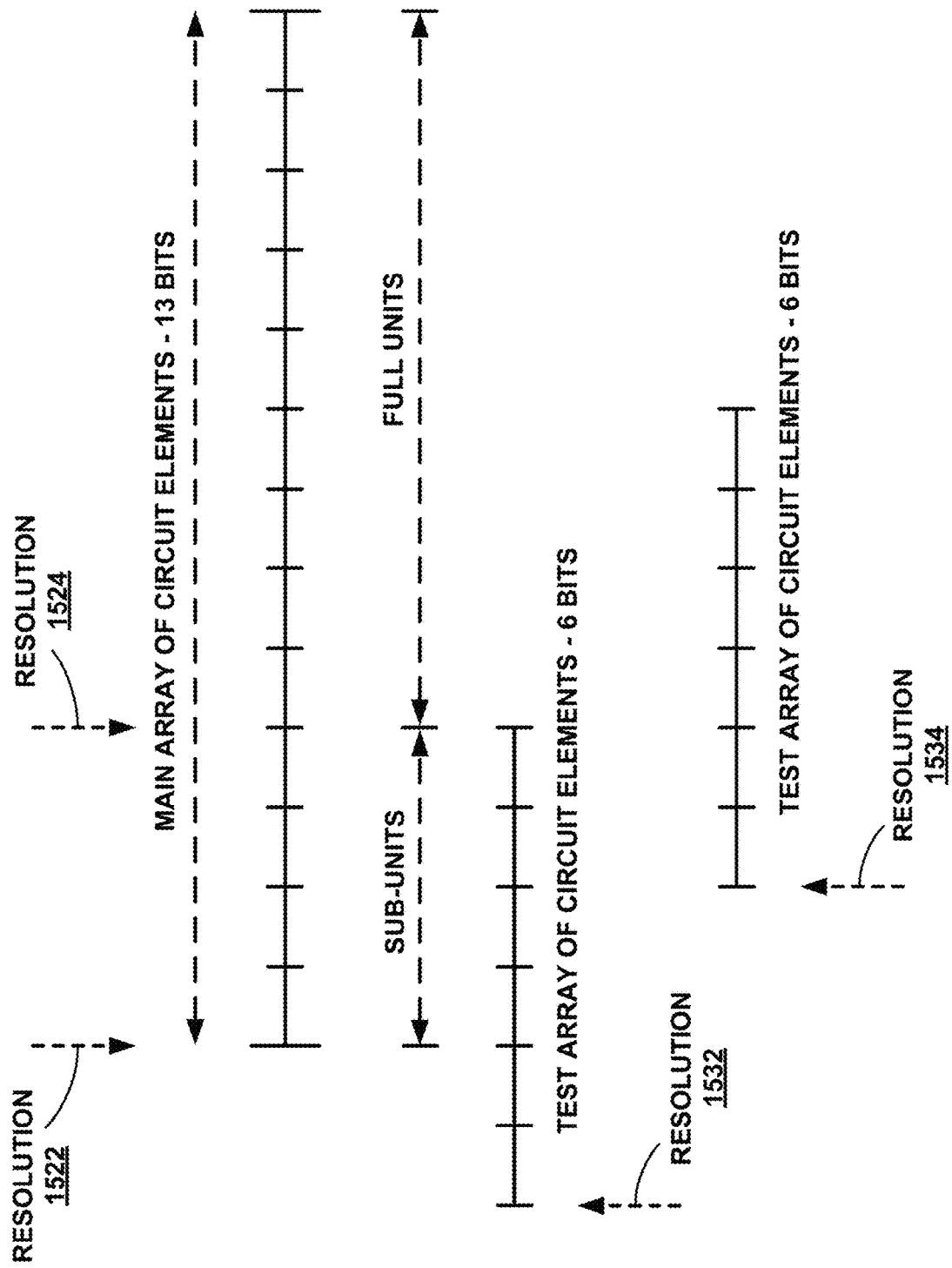
FIG. 15 is a diagram illustrating two test measurement ranges of parameter values with different resolutions, in accordance with some examples of this disclosure.

In the example of FIG. 14, switches 1460 are configured to deliver one of two voltage signals to test array 1410. In response to receiving a first voltage signal, test array 1410 may be configured to output test signal 1470 with a first test measurement range. Processing circuitry may use the first measurement range to test the unit elements of a main array of circuit elements. In response to receiving a second voltage signal, test array 1410 may be configured to output test signal 1470 with a second test measurement range that is less than the first test measurement range. Processing circuitry may use the second test measurement range to test the sub-units of the main array of circuit elements. Thus, the range of test signal may be based on range select signal 1446, and the relative amplitude of test signal 1470 within that range may be based on test level select signal 1444. In the example of FIG. 15, the first test measurement range may have resolution 1534, and the second test measurement range may have resolution 1532.

In a unipolar implementation, test signal generator 1414 can divide reference voltage 1422 to a suitable signal range. In some examples, the divided voltage signal may be approximately equal to the voltage level of reference voltage 1422 divided by the number of portions of the main array. Switches 1460 may be configured to deliver the divided voltage signal to test array 1410 with an appropriate resolution to cover a portion of a main array.

FIG. 15 is a diagram illustrating two test measurement ranges of parameter values with different resolutions, in accordance with some examples of this disclosure. FIG. 15 depicts an example of the operation of test array 1410 and test signal generator 1414 shown in FIG. 14. In some examples, reference voltage 1422 has a voltage level of 1.2 volts, such that the main array has a main measurement range of 2.4 volts, from positive 1.2 volts to negative 1.2 volts. If the main array has nine bits of resolution (e.g., 512 unit elements), then resolution 1524 of each LSB of the main array of circuit elements is approximately 4.5 millivolts (equal to 2.4 volts divided by 512). The main array may also include four additional LSBs of resolution due to sub-units in the main array, as shown in FIG. 15, such that resolution 1522 of the main array is extended to approximately two hundred and fifty microvolts.

Test array 1410 may have six bits of resolution (e.g., 64 unit elements). When the processing circuitry delivers a first range select signal to switches 1460, the test measurement range may be 75 millivolts with resolution 1534 of approximately 1.2 millivolts. Resolution 1534 is four times finer than resolution 1524 to provide extra precision in testing each unit element of the main array. For example, the processing circuitry may be configured to run a conversion algorithm on each parameter value outputted by the test array and check the set of results for at least three instances of each ADC result.

When a BIST control delivers a second range select signal to switches 1460, the test measurement range may be approximately 4.5 millivolts with resolution 1532 of approximately 75 microvolts. Resolution 1532 is four times finer than resolution 1522 to provide extra precision for testing each sub-unit element of the main array. The processing circuitry may be configured to use resolution 1532 only to test the sub-units because of the reduced test measurement range associated with resolution 1532.

Figure 16:
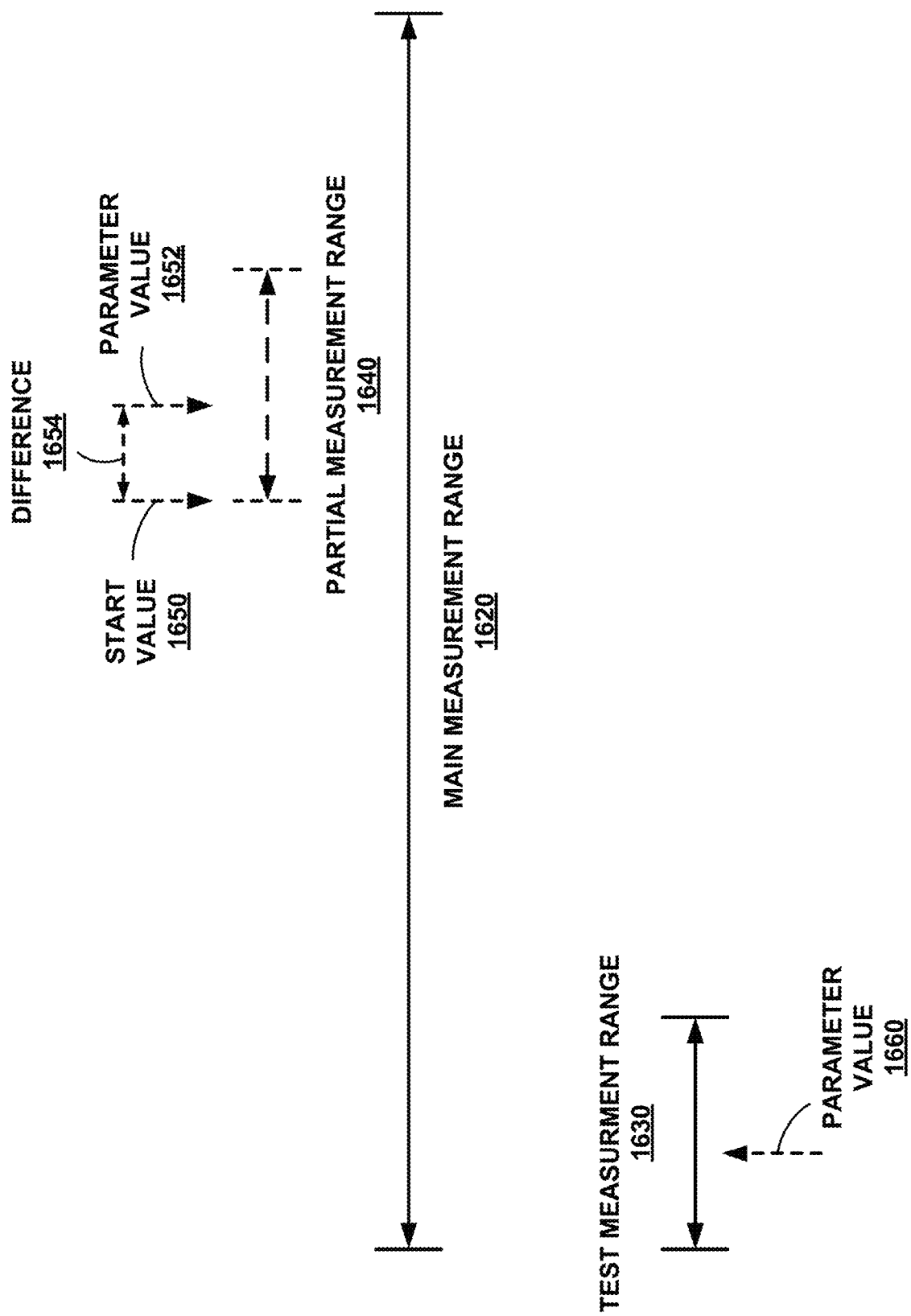
FIG. 16 is a conceptual diagram illustrating a test of a portion of a main measurement range of parameter values and the using a test measurement range of parameter values, in accordance with some examples of this disclosure.

FIG. 16 is a conceptual diagram illustrating a test of a portion of a main measurement range 1640 of parameter values and the using a test measurement range 1630 of parameter values, in accordance with some examples of this disclosure. The techniques of FIG. 16 are described with reference to device 400 in FIG. 4, although other components may exemplify similar techniques. Processing circuitry 440 may be configured to select portion 422 of main array 420, where portion 422 represents partial measurement range 1640 and main array 420 represents main measurement range 1620. In some examples, processing circuitry 440 selects portion 422 by selecting start value 1650, which may affect which unit elements of main array 420 are selected.

Processing circuitry 440 may be configured to use test array 410 to test portion 422, where test array 410 represents test measurement range 1630. In the example of FIG. 16, partial measurement range 1640 is equal to test measurement range 1630. Processing circuitry 440 may be configured to cause test array 410 to output a test signal corresponding to parameter value 1660. Processing circuitry 440 may then be configured to run a conversion algorithm on portion 422 for parameter value 1660. Processing circuitry 440 may be configured to store the result of running the conversion algorithm to a memory, where the result may be equal to parameter value 1652 of partial measurement range 1640. Difference 1654 between parameter value 1652 and start value 1650 may be equal to parameter value 1660.

In response to determining that the result of running the conversion algorithm is equal to parameter value 1652, processing circuitry 440 may be configured to determine a pass condition for the test. In response to determining that the result of running the conversion algorithm is not equal to parameter value 1652, processing circuitry 440 may be configured to determine a fail condition for the test.

Processing circuitry 440 may be configured to cause test array 410 to perform a sweep across test measurement range 1630 to test partial measurement range 1640. For each parameter value outputted by test array 410, processing circuitry 440 may be configured to run a conversion algorithm and then determine and store the result. Processing circuitry 440 may be further configured to evaluate the set of results from the test by checking the set of results for each parameter value within partial measurement range 1640. In some examples where the resolution of test array 410 is greater than the resolution of portion 422, processing circuitry 440 may be configured to check the set of results for a plurality of each parameter value within partial measurement range 1640. If test array has M bits of additional resolution, as compared to portion 422, processing circuitry 440 may be configured to check the set of results for $2^M-1$ instances of each parameter value within partial measurement range 1640. Thus, if test array 410 has two bits of additional resolution, processing circuitry 440 can check the set of results for three instances of each parameter value in the set of results.

Figure 17:
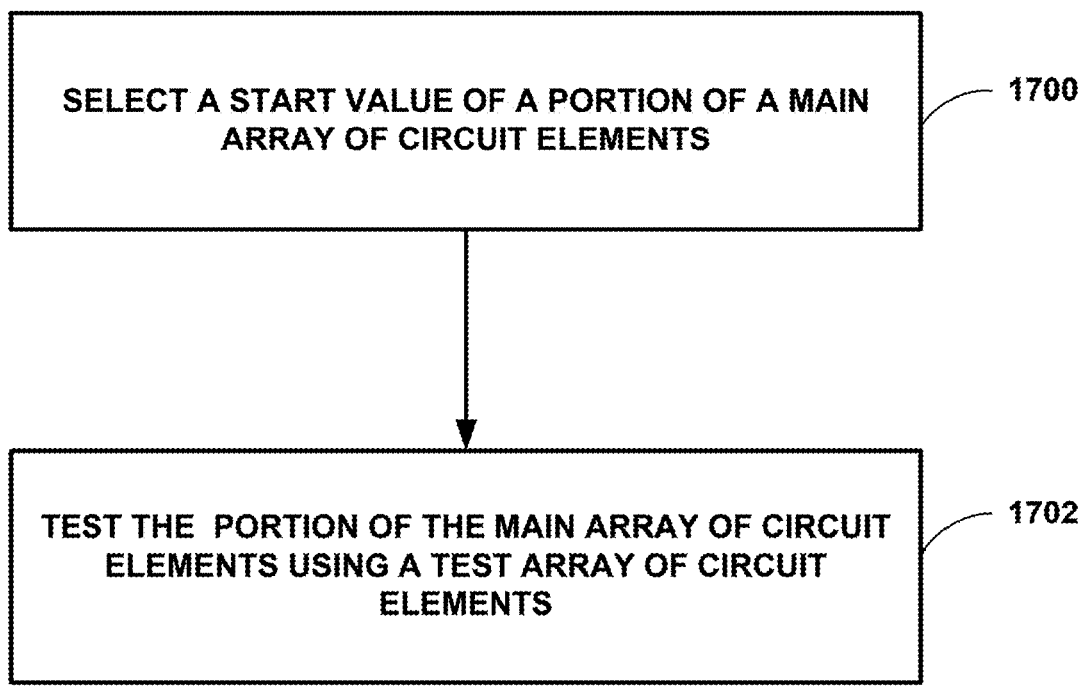
FIG. 17 is a flow diagram illustrating example techniques for testing a main array of circuit elements, in accordance with some examples of this disclosure.

FIG. 17 is a flowchart illustrating example techniques for testing a main array of circuit elements, in accordance with some examples of this disclosure. The techniques of FIG. 17 are described with reference to device 400 in FIG. 4, although other components, such as ADC 100 shown in FIG. 1, array of circuit elements 200 shown in FIG. 2, BIST control 542, 642, and 742 shown in FIGS. 5-7, may exemplify similar techniques.

In the example of FIG. 17, processing circuitry 440 selects portion 422 of main array of circuit elements 420 (1700). Portion 422 may include some of the circuit elements that are a part of main array 420. In the example of FIG. 2, portion 422 may include the circuit elements in column 210C of main array 200. Processing circuitry 440 may be configured to select portion 422 by setting a start value for a conversion algorithm.

In the example of FIG. 17, processing circuitry 440 tests portion 422 using test array of circuit elements 410 (1702). Processing circuitry 440 may be configured to cause test array 410 to perform a test sweep by outputting a set of parameter values across a test measurement range of parameter values represented by test array 410. Processing circuitry 440 may be configured to run a conversion algorithm for each parameter value outputted by test array 410 and evaluate the results of running the conversion algorithm on each parameter value.

Figure 18:
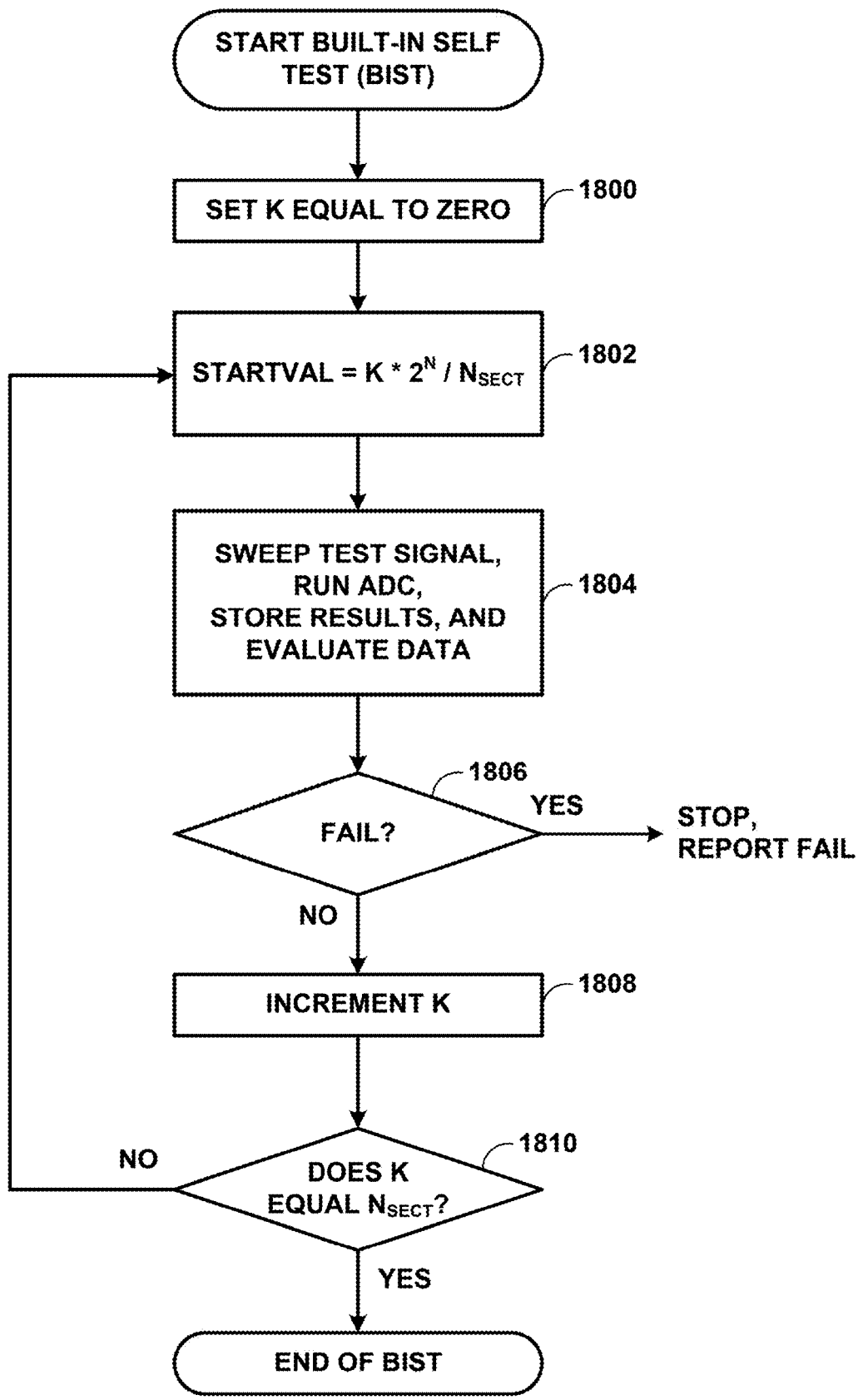
FIG. 18 is a flow diagram illustrating example techniques for BIST control, in accordance with some examples of this disclosure.

FIG. 18 is a flow diagram illustrating example techniques for BIST control, in accordance with some examples of this disclosure. The techniques of FIG. 18 are described with reference to FIGS. 4 and 8A-13B, although other components and figures may exemplify similar techniques.

In the example of FIG. 18, processing circuitry 440 sets a variable K equal to zero (1800). The variable K may represent a specific portion in main array 920 shown in FIG. 8. For example, processing circuitry 440 can determine that portion 1322 shown in FIG. 13 is column zero, that portion 1222 shown in FIG. 12 is column one, and so on. Processing circuitry 440 can use the current value of the variable K to determine which portion of main array 420 to test.

In the example of FIG. 18, processing circuitry 440 sets a start value equal to K times $2^N/n_{sect}$ (1802). For the examples of FIGS. 8B-13B, the resolution N of the main array is equal to six bits, the number of bits $2^N$ is equal to 64, and the number of sections (e.g., columns) $n_{sect}$ is equal to eight. Processing circuitry 440 can determine that portion 1322 shown in FIG. 13 has a start value of zero and that portion 1222 shown in FIG. 12 has a start value of eight.

In the example of FIG. 18, processing circuitry 440 sweeps a test signal, runs the ADC, stores the results, and evaluates the data (1804). Processing circuitry 440 may be configured to sweep a test signal by causing test array 410 to output a series of parameter values within portion 422. In the example of FIGS. 8B-13B, where each portion has a partial measurement range of eight unit elements, processing circuitry 440 can cause the test array to output values between zero and eight. For each parameter value outputted by test array 410, processing circuitry 440 may be configured to run the ADC by running a conversion algorithm, as shown in FIG. 2. Processing circuitry 440 may then be configured to store the results of running the conversion algorithm on each parameter value outputted by test array 410. Processing circuitry 440 may be configured to evaluate the data by checking the results for any missing codes or by performing a statistical analysis of the stored data.

In the example of FIG. 18, processing circuitry 440 determines whether the evaluated data indicates a fail condition (1806). Processing circuitry 440 may be configured to determine a fail condition in response to determining a missing code. In some examples, processing circuitry may be configured to check for a threshold number of each code in the set of results and determine a fail condition in response to finding less than the threshold number of any code in the set of results. In response to determining a fail condition, processing circuitry 440 may be configured to stop the test and report the fail condition by, for example, outputting an alert signal and/or communicating the fail condition to an external device or to a user.

In the example of FIG. 18, in response to determining that the evaluated data does not indicate a fail condition, processing circuitry 440 increments the K variable (1808). Processing circuitry 440 then determines whether the K variable equals $n_{sect}$ (1810). As shown in the example of FIG. 8, if $n_{sect}$ equals eight, processing circuitry 440 will end the BIST after testing portion seven of the main array 420. In response to determining that the variable K does not equal $n_{sect}$, processing circuitry 440 may be configured to set the start value to test the next portion of main array 420. For example, after testing portion 1322 shown in FIG. 13, processing circuitry 440 can set the start value to eight to test portion 1222 shown in FIG. 12.

Processing circuitry 440 may be configured to test a first portion of main array 420 using a test sweep. After testing the first portion, processing circuitry 440 may be configured to test a second portion of main array 420 by setting a new start value and performing another test sweep. To perform the test sweep in the example of FIG. 9B, processing circuitry 440 may be configured to set the start value to 32 and cause test array 410 to output zero, one, two, three, four, five, six, and seven. In some examples, processing circuitry 440 is configured to cause test array 410 to output fractional values between each integer value to provide better resolution for the testing procedure.

For each parameter value outputted by test array 410, processing circuitry 440 may be configured to run a conversion algorithm, determine a result, and store the result to a memory. After the test sweep is complete, processing circuitry 440 may be configured to evaluate the set of results to determine a pass condition or a fail condition. In some examples, processing circuitry 440 can check each result during the test sweep to determine the pass condition or the fail condition before the end of the test sweep. In response to determining a fail condition, processing circuitry 440 may be configured to stop the test and output a signal indicating the fail condition.

The following numbered examples demonstrate one or more aspects of the disclosure.

Example 1. A device includes a main array of circuit elements representing a main measurement range of parameter values and a test array of circuit elements representing a test measurement range of parameter values, the test measurement range being less than the main measurement range. The device also includes processing circuitry configured to select a portion of the main array of circuit elements representing a partial measurement range, the partial measurement range being less than or equal to the test measurement range. The processing circuitry is also configured to test the portion of the main array of circuit elements using the test array of circuit elements.

Example 2. The device of example 1, where the processing circuitry is further configured to evaluate a result of testing the portion of the main array of circuit elements to determine a pass condition or a fail condition for the portion of the main array of circuit elements.

Example 3. The device of examples 1-2 or any combination thereof, where the test measurement range is a first test measurement range of parameter values. The processing circuitry is further configured to cause the test array of circuit elements to represent a second test measurement range of parameter values, the second test measurement range being less than the first test measurement range.

Example 4. The device of examples 1-3 or any combination thereof, where the portion of the main array of circuit elements is a first portion of the main array of circuit elements representing a first partial measurement range of parameter values. The processing circuitry is further configured to select a second portion of the main array of circuit elements representing a second partial measurement range, the second partial measurement range being less than or equal to the second test measurement range. The processing circuitry is also configured to test the second portion of the main array of circuit elements using the test array of circuit elements.

Example 5. The device of examples 1-4 or any combination thereof, where a resolution of the test array of circuit elements representing the second test measurement range of parameter values is finer than a resolution of the test array of circuit elements representing the first test measurement range of parameter values.

Example 6. The device of examples 1-5 or any combination thereof, where the processing circuitry is configured to test the portion of the main array of circuit elements at least in part by running a conversion algorithm.

Example 7. The device of examples 1-6 or any combination thereof, where the processing circuitry is further configured to introduce an error into the conversion algorithm to validate the testing of the portion of the main array of circuit elements.

Example 8. The device of examples 1-7 or any combination thereof, where the processing circuitry is configured to test the portion of the main array of circuit elements at least in part by causing the test array of circuit elements to output a first parameter value within the test measurement range of parameter values.

Example 9. The device of examples 1-8 or any combination thereof, where the processing circuitry is configured to test the portion of the main array of circuit elements at least in part by running a conversion algorithm on the portion of the main array of circuit elements for the first parameter value outputted by the test array of circuit elements.

Example 10. The device of examples 1-9 or any combination thereof, where the processing circuitry is configured to test the portion of the main array of circuit elements at least in part by evaluating a result of running the conversion algorithm to determine a pass condition or a fail condition for the portion of the main array of circuit elements.

Example 11. The device of examples 1-10 or any combination thereof, where the processing circuitry is configured to test the portion of the main array of circuit elements at least in part by causing the test array of circuit elements to perform a sweep to output parameter values across the test measurement range of parameter values.

Example 12. The device of examples 1-11 or any combination thereof, where the processing circuitry is configured to test the portion of the main array of circuit elements at least in part by running a conversion algorithm on the portion of the main array of circuit elements for each parameter value outputted by the test array of circuit elements in the sweep.

Example 13. The device of examples 1-12 or any combination thereof, where the processing circuitry is configured to test the portion of the main array of circuit elements at least in part by storing, to a memory, a set of results of running the conversion algorithm, each result of the set of results based on a respective parameter value outputted by the test array of circuit elements in the sweep.

Example 14. The device of examples 1-13 or any combination thereof, where the processing circuitry is configured to test the portion of the main array of circuit elements at least in part by evaluating each result of the set of results to determine a respective pass condition or a respective fail condition for the respective parameter value outputted by the test array of circuit elements.

Example 15. The device of examples 1-14 or any combination thereof, where the processing circuitry is configured to evaluate each result of the set of results at least in part by checking the set of results for each parameter value of the sweep.

Example 16. The device of examples 1-14 or any combination thereof, where the processing circuitry is configured to evaluate each result of the set of results at least in part by checking the set of results for a plurality of each parameter value of the sweep.

Example 17. The device of examples 1-16 or any combination thereof, where the main array of circuit elements, the test array of circuit elements and the processing circuitry are integrated on a same semiconductor substrate.

Example 18. The device of examples 1-17 or any combination thereof, where the processing circuitry is configured to control a BIST of the main array of circuit elements using the test array of circuit elements.

Example 19. The device of examples 1-18 or any combination thereof, where the main array of circuit elements includes a main array of capacitors, and the test array of circuit elements includes a test array of capacitors.

Example 20. A method includes selecting a portion of a main array of circuit elements, the main array of circuit elements representing a main measurement range, and the portion of the main array of circuit elements representing a partial measurement range. The method further includes testing the portion of the main array of circuit elements using a test array of circuit elements representing a test measurement range of parameter values, the test measurement range being less than the main measurement range, and the partial measurement range being less than or equal to the test measurement range.

Example 21. The method of example 20, further including evaluating a result of testing the portion of the main array of circuits elements to determine a pass condition or a fail condition for the portion of the main array of circuit elements.

Example 22. The method of examples 20-21 or any combination thereof, where the test measurement range is a first test measurement range of parameter values. The method further includes causing the test array of circuit elements to represent a second test measurement range of parameter values, the second test measurement range being less than the first test measurement range.

Example 23. The method of examples 20-22 or any combination thereof, further including selecting a second portion of the main array of circuit elements representing a second partial measurement range, the second partial measurement range being less than or equal to the second test measurement range.

Example 24. The method of examples 20-23 or any combination thereof, further including testing the second portion of the main array of circuit elements using the test array of circuit elements.

Example 25. The method of examples 20-24 or any combination thereof, where testing the portion of the main array of circuit elements includes running a conversion algorithm.

Example 26. The method of examples 20-25 or any combination thereof, further including introducing an error into the conversion algorithm to validate the testing of the portion of the main array of circuit elements.

Example 27. The method of examples 20-26 or any combination thereof, where testing the portion of the main array of circuit elements includes causing the test array of circuit elements to output a first parameter value within the test measurement range of parameter values.

Example 28. The method of examples 20-27 or any combination thereof, where testing the portion of the main array of circuit elements includes running a conversion algorithm on the main array of circuit elements for the first parameter value outputted by the test array of circuit elements.

Example 29. The method of examples 20-28 or any combination thereof, where testing the portion of the main array of circuit elements includes evaluating a result of running the conversion algorithm to determine a pass condition or a fail condition for the portion of the main array of circuit elements.

Example 30. The method of examples 20-29 or any combination thereof, where testing the portion of the main array of circuit elements includes causing the test array of circuit elements to perform a sweep to output parameter values across the test measurement range of parameter values.

Example 31. The method of examples 20-30 or any combination thereof, where testing the portion of the main array of circuit elements includes running a conversion algorithm on the main array of circuit elements for each parameter value outputted by the test array of circuit elements in the sweep.

Example 32. The method of examples 20-31 or any combination thereof, where testing the portion of the main array of circuit elements includes storing, to a memory, a set of results of running the conversion algorithm, each result of the set of results based on a respective parameter value outputted by the test array of circuit elements in the sweep.

Example 33. The method of examples 20-32 or any combination thereof, where testing the portion of the main array of circuit elements includes evaluating each result of the set of results to determine a respective pass condition or a respective fail condition for the respective parameter value outputted by the test array of circuit elements.

Example 34. The method of examples 20-33 or any combination thereof, where evaluating each result includes evaluate each result of the set of results at least in part by checking the set of results for each parameter value of the sweep.

Example 35. The method of examples 20-34 or any combination thereof, where evaluating each result includes evaluate each result of the set of results at least in part by checking the set of results for a plurality of each parameter value of the sweep.

Example 36. The method of examples 20-35 or any combination thereof, further including controlling a BIST of the main array of circuit elements using the test array of circuit elements.

Example 37. An ADC configured to generate a digital result signal based on an analog input signal, where the ADC includes a sampling array of circuit elements configured to receive the analog input signal and generate a sampled signal. The ADC also includes a main DAC circuit including a main array of circuit elements representing a main measurement range of parameter values, where the main DAC circuit is configured to receive a reference signal and a control signal and generate an approximation signal based on the reference signal and the control signal. The ADC also includes comparator circuitry configured to generate a comparison signal based on whether the sampled signal is greater than the approximation signal. The ADC further includes a test signal generator including a test array of circuit elements representing a test measurement range of parameter values, where the main measurement range is greater than the test measurement range. The ADC includes digital control circuitry configured to generate the control signal based on the comparison signal and further based on a conversion algorithm and deliver the control signal to the main DAC circuit. The digital control circuitry is further configured to generate the digital result signal based on the conversion algorithm and select a start value of a portion of the main array of circuit elements representing a partial measurement range, the partial measurement range being less than or equal to the test measurement range. The digital control circuitry is also configured to test the portion of the main array of circuit elements using the test array of circuit elements based on the conversion algorithm.

Example 38. The ADC of example 37, where the processing circuitry is further configured to evaluate a result of testing the portion of the main array of circuit elements to determine a pass condition or a fail condition for the portion of the main array of circuit elements.

Example 39. The ADC of examples 37-38 or any combination thereof, where the test measurement range is a first test measurement range of parameter values. The processing circuitry is further configured to cause the test array of circuit elements to represent a second test measurement range of parameter values, the second test measurement range being less than the first test measurement range.

Example 40. The ADC of examples 37-39 or any combination thereof, where the processing circuitry is further configured to introduce an error into the conversion algorithm to validate the testing of the portion of the main array of circuit elements.

Example 41. The ADC of examples 37-40 or any combination thereof, where the processing circuitry is further configured to perform the method of examples 20-36 or any combination thereof.

Example 42. A device including a computer-readable medium having executable instructions stored thereon, configured to be executable by processing circuitry for causing the processing circuitry to select a portion of a main array of circuit elements, the main array of circuit elements representing a main measurement range, and the portion of the main array of circuit elements representing a partial measurement range. The instructions are configured to be executable by the processing circuitry for further causing the processing circuitry to test the portion of the main array of circuit elements using a test array of circuit elements representing a test measurement range of parameter values, the test measurement range being less than the main measurement range, and the partial measurement range being less than or equal to the test measurement range.

Example 43. The device of example 42 or any combination thereof, wherein the instructions are configured to be executable by the processing circuitry for further causing the processing circuitry to perform the method of examples 20-36 or any combination thereof.

This disclosure has attributed functionality to digital control 140 and processing circuitry 440, 540, 640, and 740. Digital control 140 and processing circuitry 440, 540, 640, and 740 may include one or more processors. Digital control 140 and processing circuitry 440, 540, 640, and 740 may include any combination of integrated circuitry, discrete logic circuitry, analog circuitry, such as one or more microprocessors, DSPs, ASICs, or FPGAs. In some examples, digital control 140 and processing circuitry 440, 540, 640, and 740 may include multiple components, such as any combination of one or more microprocessors, one or more DSPs, one or more ASICs, or one or more FPGAs, as well as other discrete or integrated logic circuitry, and/or analog circuitry.

The techniques described in this disclosure may also be embodied or encoded in an article of manufacture including a non-transitory computer-readable storage medium, such as memory 670. Example non-transitory computer-readable storage media may include RAM, ROM, programmable ROM (PROM), erasable programmable ROM (EPROM), electronically erasable programmable ROM (EEPROM), flash memory, a hard disk, a compact disc ROM (CD-ROM), a floppy disk, a cassette, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Various examples of the disclosure have been described. Any combination of the described systems, operations, or functions is contemplated. These and other examples are within the scope of the following claims.

What is claimed is:

1. A device comprising:
   a main array of circuit elements representing a main measurement range of parameter values;
   a test array of circuit elements representing a test measurement range of parameter values, the test measurement range being less than the main measurement range, and the test array of circuit elements being separate from the main array of circuit elements; and
   processing circuitry configured to:
      select a first portion of the main array of circuit elements representing a first partial measurement range, the first partial measurement range being less than or equal to the test measurement range;
      test the first portion of the main array of circuit elements using the test array of circuit elements;
      select a second portion of the main array of circuit elements representing a second partial measurement range, wherein at least some circuit elements of the second portion are different than circuit elements of the first portion; and test the second portion of the main array of circuit elements using the test array of circuit elements.

2. The device of claim 1, wherein the processing circuitry is further configured to evaluate a result of testing the first portion of the main array of circuit elements to determine a pass condition or a fail condition for the first portion of the main array of circuit elements.

3. The device of claim 1,
wherein the test measurement range is a first test measurement range of parameter values, and
wherein the processing circuitry is further configured to cause the test array of circuit elements to represent a second test measurement range of parameter values, the second test measurement range being less than the first test measurement range.

4. The device of claim 3, wherein a resolution of the test array of circuit elements representing the second test measurement range of parameter values is finer than a resolution of the test array of circuit elements representing the first test measurement range of parameter values.

5. The device of claim 1,
wherein the processing circuitry is configured to test the first portion of the main array of circuit elements at least in part by running a conversion algorithm, and
wherein the processing circuitry is further configured to introduce an error into the conversion algorithm to validate the testing of the first portion of the main array of circuit elements.

6. The device of claim 1, wherein the processing circuitry is configured to test the first portion of the main array of circuit elements at least in part by:
causing the test array of circuit elements to output a first parameter value within the test measurement range of parameter values;
running a conversion algorithm on the first portion of the main array of circuit elements for the first parameter value outputted by the test array of circuit elements; and
evaluating a result of running the conversion algorithm to determine a pass condition or a fail condition for the first portion of the main array of circuit elements.

7. The device of claim 1, wherein the processing circuitry is configured to test the first portion of the main array of circuit elements at least in part by:
causing the test array of circuit elements to perform a sweep to output parameter values across the test measurement range of parameter values;
running a conversion algorithm on the first portion of the main array of circuit elements for each parameter value outputted by the test array of circuit elements in the sweep;
storing, to a memory, a set of results of running the conversion algorithm, each result of the set of results based on a respective parameter value outputted by the test array of circuit elements in the sweep; and
evaluating each result of the set of results to determine a respective pass condition or a respective fail condition for the respective parameter value outputted by the test array of circuit elements.

8. The device of claim 7, wherein the processing circuitry is configured to evaluate each result of the set of results at least in part by checking the set of results for each parameter value of the sweep.

9. The device of claim 7, wherein the processing circuitry is configured to evaluate each result of the set of results at least in part by checking the set of results for a plurality of each parameter value of the sweep.

10. The device of claim 1, wherein the main array of circuit elements, the test array of circuit elements and the processing circuitry are integrated on a same semiconductor substrate.

11. The device of claim 1, wherein the processing circuitry is configured to control a built-in self-test (BIST) of the main array of circuit elements using the test array of circuit elements.

12. The device of claim 1,
wherein the main array of circuit elements comprises a main array of capacitors, and
wherein the test array of circuit elements comprises a test array of capacitors.

13. A method comprising:
selecting a first portion of a main array of circuit elements, the main array of circuit elements representing a main measurement range, and the first portion of the main array of circuit elements representing a partial measurement range;
testing the first portion of the main array of circuit elements using a test array of circuit elements representing a test measurement range of parameter values, the test array of circuit elements being separate from the main array of circuit elements, the test measurement range being less than the main measurement range, and the partial measurement range being less than or equal to the test measurement range;
selecting a second portion of the main array of circuit elements representing a second partial measurement range, wherein at least some circuit elements of the second portion are different than the first circuit elements; and
testing the second portion of the main array of circuit elements using the test array of circuit elements.

14. The method of claim 13, further comprising evaluating a result of testing the first portion of the main array of circuits elements to determine a pass condition or a fail condition for the first portion of the main array of circuit elements.

15. The method of claim 13,
wherein the test measurement range is a first test measurement range of parameter values,
the method further comprising causing the test array of circuit elements to represent a second test measurement range of parameter values, the second test measurement range being less than the first test measurement range.

16. The method of claim 13, wherein testing the first portion of the main array of circuit elements comprises running a conversion algorithm, the method further comprising introducing an error into the conversion algorithm to validate the testing of the first portion of the main array of circuit elements.

17. The method of claim 13, wherein testing the first portion of the main array of circuit elements comprises:
causing the test array of circuit elements to output a first parameter value within the test measurement range of parameter values; and
running a conversion algorithm on the main array of circuit elements for the first parameter value outputted by the test array of circuit elements.

18. The method of claim 13, wherein testing the first portion of the main array of circuit elements comprises:

causing the test array of circuit elements to perform a sweep to output parameter values across the test measurement range of parameter values;

running a conversion algorithm on the main array of circuit elements for each parameter value outputted by the test array of circuit elements in the sweep;

storing, to a memory, a set of results of running the conversion algorithm, each result of the set of results based on a respective parameter value outputted by the test array of circuit elements in the sweep; and evaluating each result of the set of results to determine a respective pass condition or a respective fail condition for the respective parameter value outputted by the test array of circuit elements.

19. An analog-to-digital converter (ADC) configured to generate a digital result signal based on an analog input signal, the ADC comprising:

a sampling array of circuit elements configured to receive the analog input signal and generate a sampled signal;

a main digital-to-analog conversion (DAC) circuit including a main array of circuit elements representing a main measurement range of parameter values, wherein the main DAC circuit is configured to:

receive a reference signal and a first control signal; and generate an approximation signal based on the reference signal and the first control signal;

comparator circuitry configured to generate a comparison signal based on whether the sampled signal is greater than the approximation signal;

a test signal generator including a test array of circuit elements representing a test measurement range of parameter values, wherein the main measurement range is greater than the test measurement range, and wherein the test array of circuit elements are separate from the main array of circuit elements; and digital control circuitry configured to:

generate a second control signal based on the comparison signal and further based on a conversion algorithm;

deliver the second control signal to the main DAC circuit;

generate the digital result signal based on the conversion algorithm;

select a first start value of a first portion of the main array of circuit elements representing a first partial measurement range, the first partial measurement range being less than or equal to the test measurement range;

test the first portion of the main array of circuit elements using the test array of circuit elements based on the conversion algorithm;

select a second start value of a second portion of the main array of circuit elements representing a second partial measurement range, wherein at least some circuit elements of the second portion are different than the first circuit elements;

test the second portion of the main array of circuit elements using the test array of circuit elements based on the conversion algorithm.

20. The ADC of claim 19, wherein the digital control circuitry is configured to test the first portion of the main array of circuit elements at least in part by:

causing the test array of circuit elements to output a first parameter value within the test measurement range of parameter values;

running the conversion algorithm on the first portion of the main array of circuit elements for the first parameter value outputted by the test array of circuit elements; and evaluating a result of running the conversion algorithm to determine a pass condition or a fail condition for the first portion of the main array of circuit elements.

* * * * *